United States Patent
Tu et al.

(10) Patent No.: US 7,282,757 B2
(45) Date of Patent: Oct. 16, 2007

(54) MIM CAPACITOR STRUCTURE AND METHOD OF MANUFACTURE

(75) Inventors: Kuo-Chi Tu, Hsin-Chu (TW); Chun-Yao Chen, Hsin-Chu (TW); Shou-Gwo Wuu, Hsin-Chu (TW); Chen-Jong Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 395 days.

(21) Appl. No.: 10/689,294

(22) Filed: Oct. 20, 2003

(65) Prior Publication Data
US 2005/0082586 A1 Apr. 21, 2005

(51) Int. Cl.
*H01L 27/105* (2006.01)
(52) U.S. Cl. .................. 257/301; 257/213; 257/288; 257/296; 257/E27.081
(58) Field of Classification Search ............... None
See application file for complete search history.

(56) References Cited

U.S. PATENT DOCUMENTS

| | | | |
|---|---|---|---|
| 6,051,462 A | 4/2000 | Ohno | |
| 6,077,775 A * | 6/2000 | Stumborg et al. | |
| 6,281,540 B1 | 8/2001 | Aoki | |
| 6,399,399 B2 | 6/2002 | Yamamoto | |
| 6,399,495 B1 | 6/2002 | Tseng et al. | |
| 6,417,537 B1 * | 7/2002 | Yang et al. | |
| 6,455,368 B2 | 9/2002 | Aoki | |
| 6,528,366 B1 | 3/2003 | Tu et al. | |
| 6,579,755 B2 | 6/2003 | Kim et al. | |
| 6,620,685 B2 | 9/2003 | Oh | |
| 2002/0017673 A1 * | 2/2002 | Maeda et al. | |
| 2003/0183862 A1 * | 10/2003 | Jin et al. | |

OTHER PUBLICATIONS

Liu, et al., Single Mask Metal-Insulator-Metal (MIM) Capacitor with Copper Damascene Metallization for Sub-0.18 μm Mixed Mode Signal and System-on-a-Chip (SoC) Applications, 2000, Lucent Technologies Bell Laboratories, Murray Hill, NJ, US.
Ishikawa, et al., High-Capacitance Cu/Ta$_2$O$_5$/Cu MIM Structure for SoC Applications Featuring a Single-Mask Add-on Process, 2002, Central Research Laboratory, Kokubunji, Tokyo, Japan.

* cited by examiner

*Primary Examiner*—Leonardo Andujar
*Assistant Examiner*—Kevin Quinto
(74) *Attorney, Agent, or Firm*—Slater & Matsil, L.L.P.

(57) ABSTRACT

A metal-insulator-metal (MIM) capacitor structure and method of manufacturing thereof. A plurality of MIM capacitor patterns is formed in two or more insulating layers. The insulating layers may comprise a via layer and a metallization layer of a semiconductor device. A top portion of the top insulating layer is recessed in a region between at least two adjacent MIM capacitor patterns. When the top plate material of the MIM capacitors is deposited, the top plate material fills the recessed area of the top insulating layer between the adjacent MIM capacitor pattern, forming a connecting region that couples together the top plates of the adjacent MIM capacitors. A portion of the MIM capacitor bottom electrode may be formed in a first metallization layer of the semiconductor device.

30 Claims, 27 Drawing Sheets

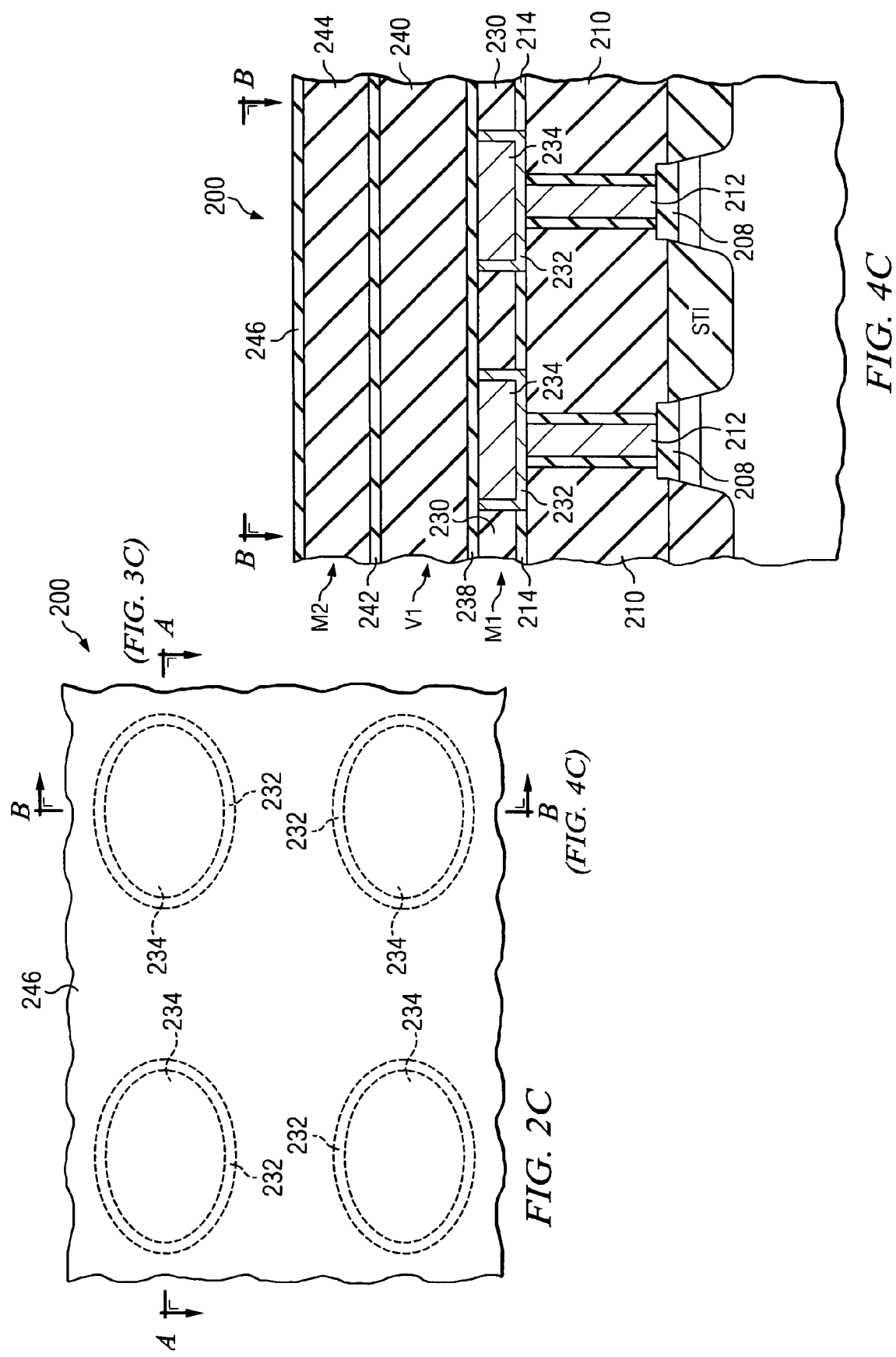

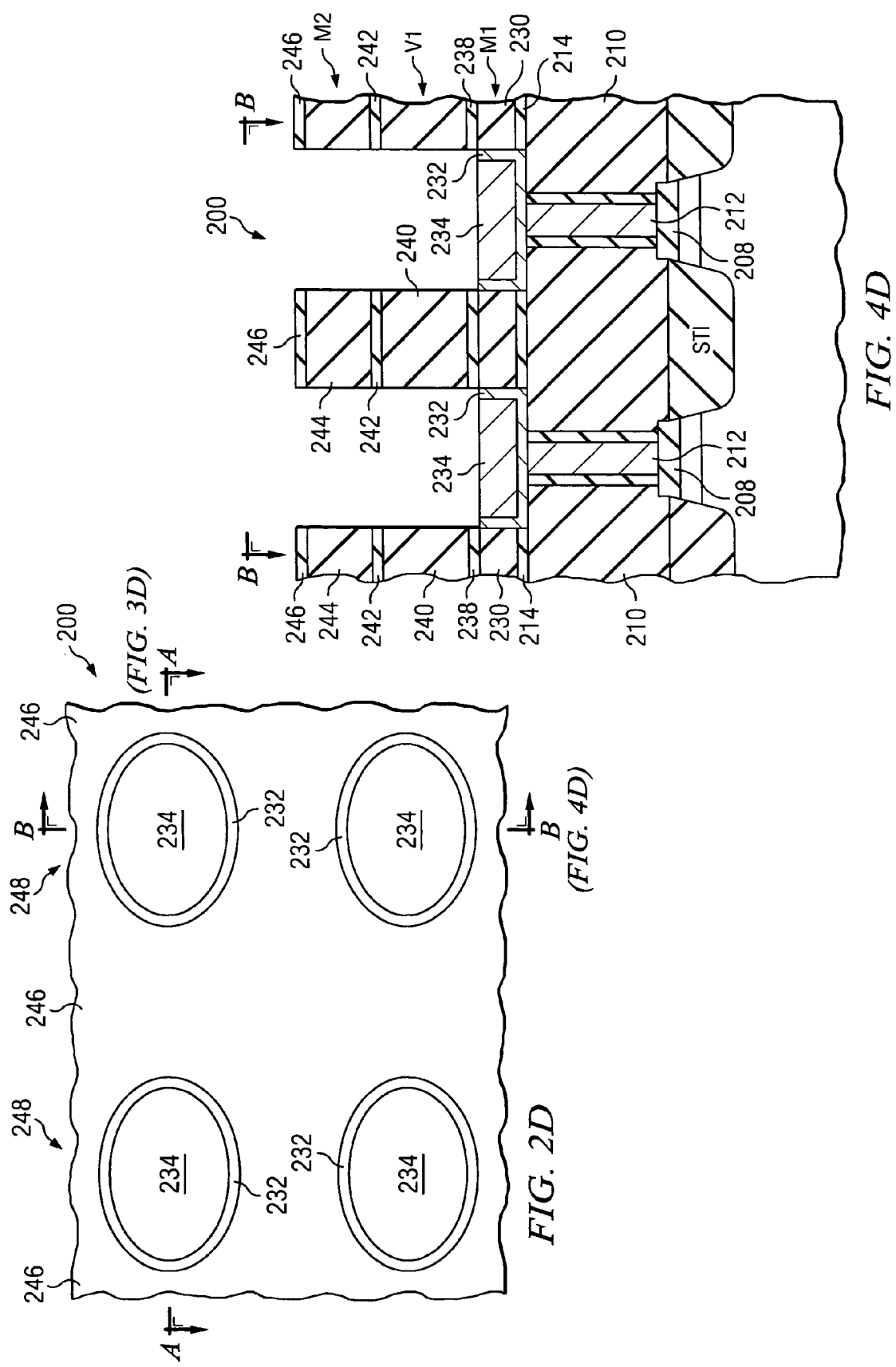

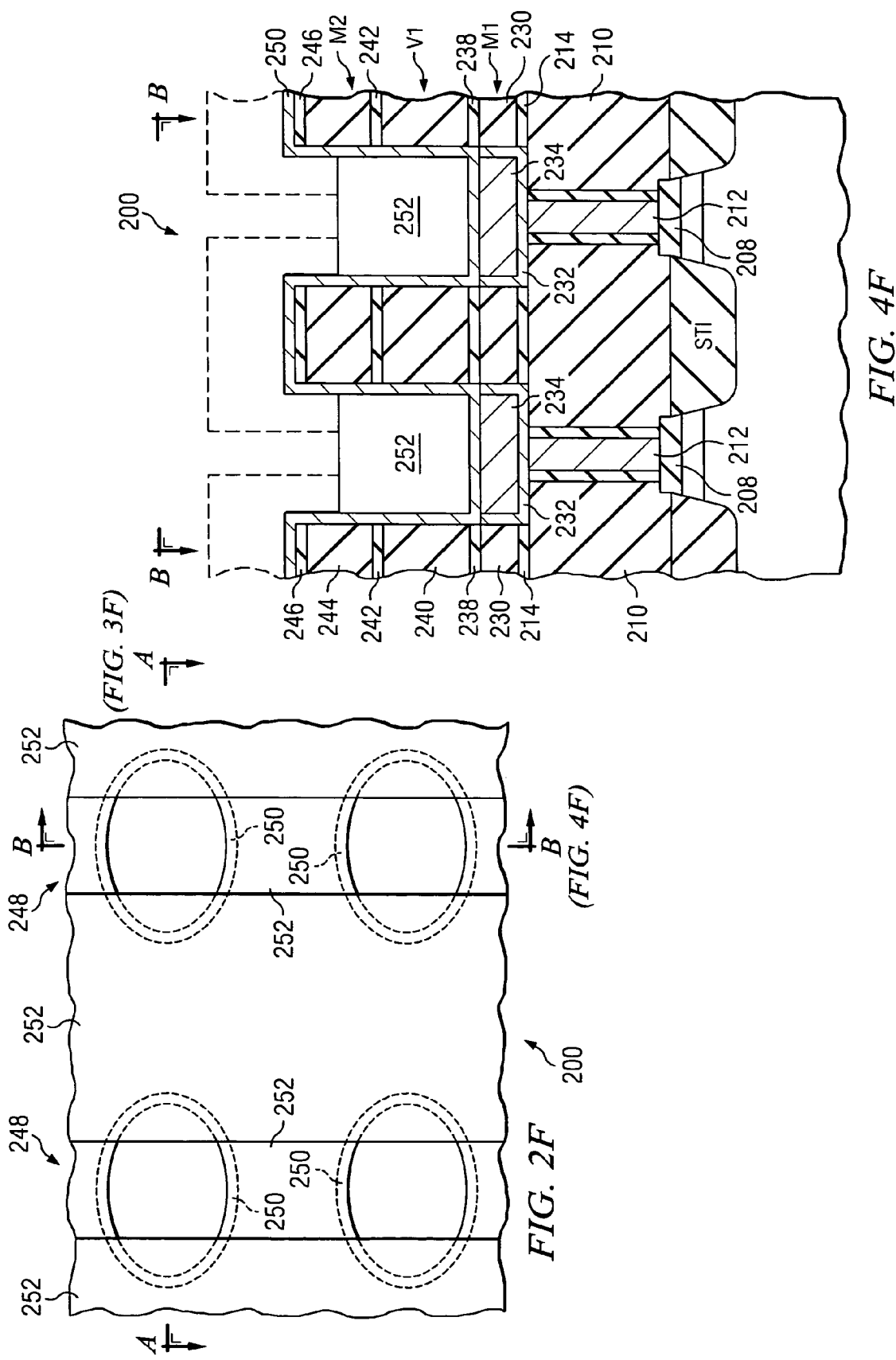

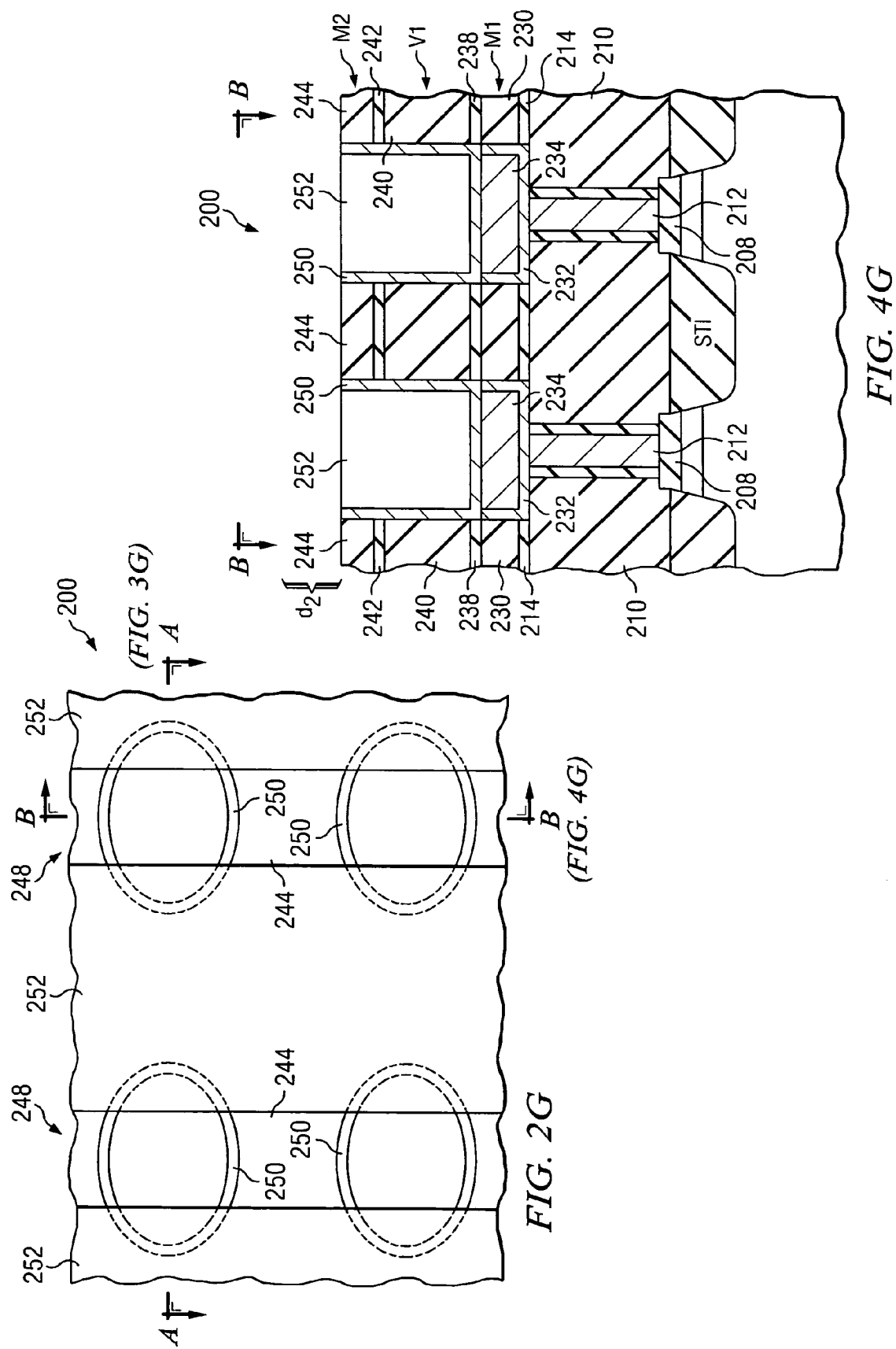

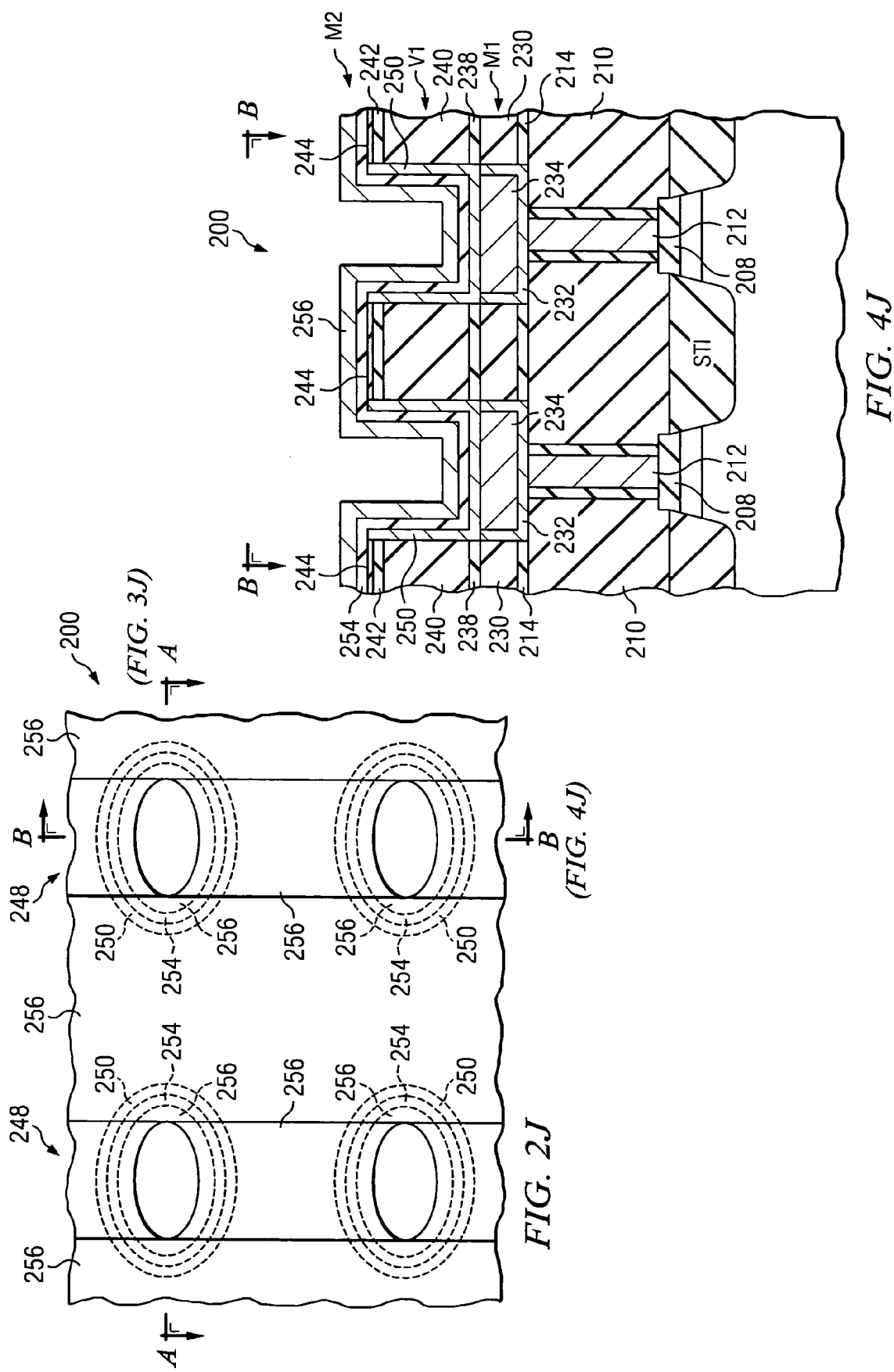

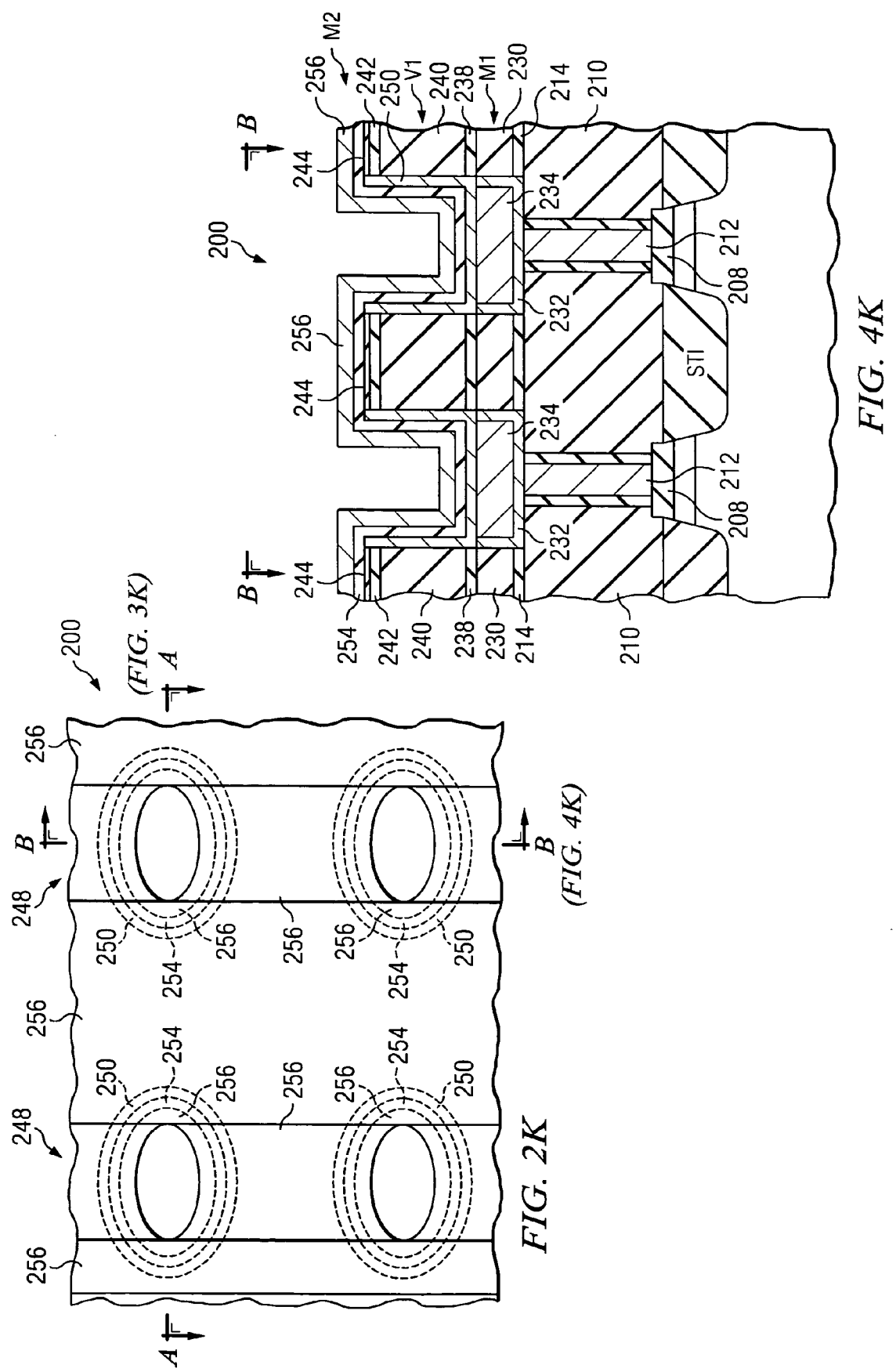

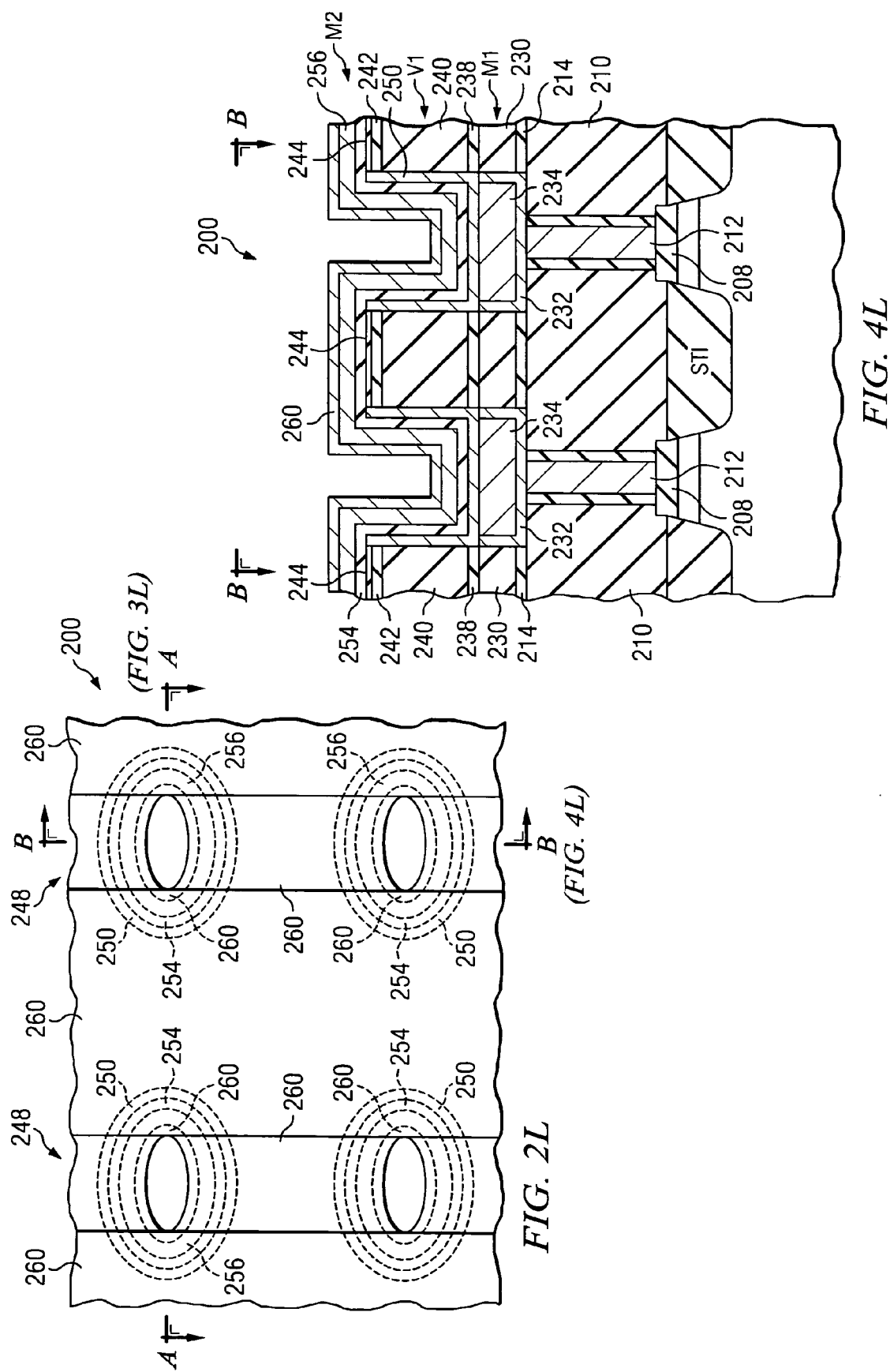

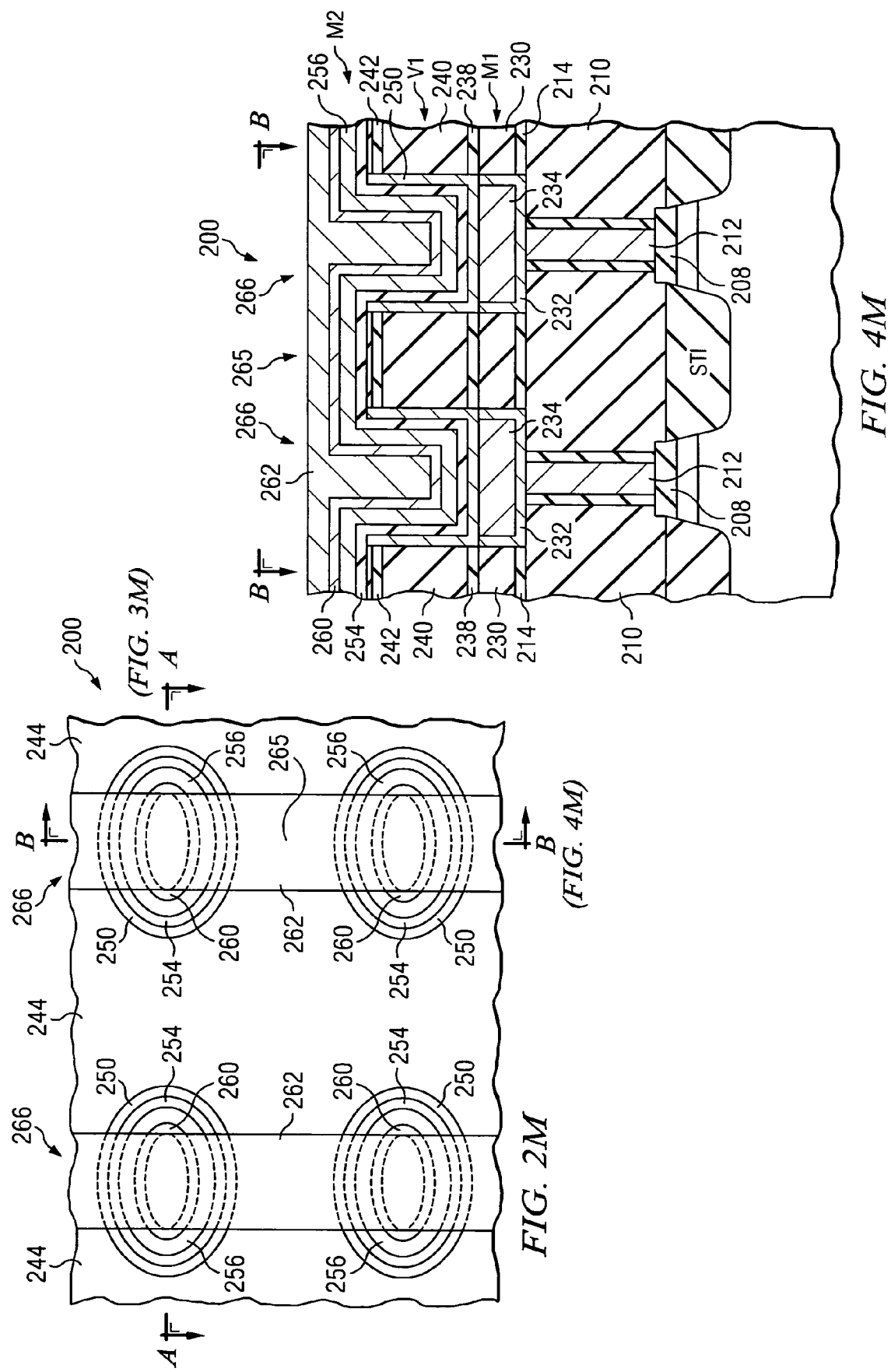

MIM CAPACITOR STRUCTURE AND METHOD OF MANUFACTURE

TECHNICAL FIELD

Embodiments of the present invention relate generally to the fabrication of semiconductor devices, and more particularly to the fabrication of metal-insulator-metal (MIM) capacitors.

BACKGROUND

Capacitors are elements that are used extensively in semiconductor devices for storing an electrical charge. Capacitors essentially comprise two conductive plates separated by an insulator. The capacitance, or amount of charge held by the capacitor per applied voltage, depends on a number of parameters such as the area of the plates, the distance between the plates, and the dielectric constant value for the insulator between the plates, as examples. Capacitors are used in filters, analog-to-digital converters, memory devices, control applications, and many other types of semiconductor devices.

One type of capacitor is a MIM capacitor, which is frequently used in mixed signal devices and logic devices, as examples. MIM capacitors are used to store a charge in a variety of semiconductor devices. MIM capacitors are often used as a storage node in a memory device, for example. A MIM capacitor is typically formed horizontally on a semiconductor wafer, with two metal plates sandwiching a dielectric layer parallel to the wafer surface. Often, one of the metal plates is formed in a metallization layer or metal interconnect layer of a semiconductor device.

A prior art semiconductor device 100 is shown in FIG. 1. The semiconductor device 100 includes a substrate 104 having a dynamic random access memory (DRAM) region and a logic region. A plurality of transistors 106 are formed in and over the substrate 104, wherein transistors 106 in the DRAM region comprise access transistors of the DRAM devices. A plurality of MIM capacitors 102 are formed in a second insulating layer 116 which comprises a single interconnect layer of the device 100, as shown. The MIM capacitors 102 comprise a bottom plate electrode 118, a dielectric layer 120 and a top plate electrode 122. The MIM capacitors 102 make electrical contact to underlying bitlines 108 by contacts 112 that are formed in a first insulating layer 110. A stop layer 114 may be disposed between the first insulating layer 110 and the second insulating layer 116. In the logic region, contacts 126 are formed to provide electrical contact to component regions and gates of transistors, as examples.

It is challenging to merge the manufacturing of capacitors 102 in DRAM regions with logic circuits in the logic region. For example, the topography created by the MIM capacitor 102 requires the use of a thick insulating layer 124 to successfully cover the MIM capacitor topography. The thick insulating layer 124 creates a higher aspect ratio for the electrical contacts 126 in the logic region. The aspect ratio of the contacts may be 10:1 to 25:1, as examples. These high aspect ratio contacts 126 are problematic because the contact pattern is difficult to etch through the thicknesses of the dielectric layers 124, 116, 114 and 110, and also because it is difficult to fill the narrow, deep contact patterns with a conductive material.

Another problem with the prior art MIM capacitor 102 structure shown in FIG. 1 is that there is often an insufficient overlap margin $d_1$ between the top plate electrode and the bitline contact 128. The margin $d_1$ may comprise 0.2 to 0.3 μm, as an example. This can lead to shorts, resulting in device failures.

SUMMARY OF THE INVENTION

Embodiments of the present invention achieve technical advantages by providing a novel MIM capacitor structure and method of fabrication, in which a MIM capacitor is formed in two or more insulating layers of a semiconductor device. The MIM capacitor may formed in a via layer and an interconnect layer of a semiconductor device, in one embodiment. An interconnect layer may be used to form a contact plug beneath the MIM capacitor, wherein the contact plug is part of the bottom electrode or plate of the MIM capacitor. Two or more adjacent MIM capacitors may be electrically connected by recessing the top insulating layer between at least two adjacent MIM capacitors, and filling the recess with a conductive material, in the same process used to fill the MIM capacitor top plate material.

In accordance with a preferred embodiment of the present invention, a semiconductor device includes a workpiece, a first insulating layer formed over the workpiece, at least one second insulating layer formed over the first insulating layer, and at least one MIM capacitor formed in the first insulating layer and the at least one second insulating layer. The at least one MIM capacitor includes a first conductive layer, a dielectric layer disposed over the first conductive layer, and a second conductive layer formed over the dielectric layer. The first conductive layer extends completely to a top surface of the at least one second insulating layer.

In accordance with another preferred embodiment of the present invention, a semiconductor device includes a workpiece, a first insulating layer formed over the workpiece, a second insulating layer formed over the first insulating layer, and at least one third insulating layer formed over the second insulating layer. At least one MIM capacitor is formed in the at least one third insulating layer, the second insulating layer, and the first insulating layer. The at least one MIM capacitor includes a first conductive layer, a dielectric layer disposed over the first conductive layer, and a second conductive layer formed over the dielectric layer.

In accordance with another preferred embodiment of the present invention, a semiconductor device includes a workpiece, at least one first insulating layer formed over the workpiece, and a plurality of MIM capacitors formed in the at least one first insulating layer. The plurality of MIM capacitors includes a first conductive layer, a dielectric layer disposed over the first conductive layer, and a second conductive layer formed over the dielectric layer. The second conductive layer comprises a top plate of the plurality of MIM capacitors. A top at least one first insulating layer comprises a recessed region between at least two adjacent MIM capacitors. The second conductive layer fills the recessed region of the top at least one first insulating layer, electrically coupling together the top plates of the at least two adjacent MIM capacitors.

In accordance with another preferred embodiment of the present invention, a method of manufacturing a semiconductor device includes providing a workpiece, depositing a first insulating layer over the workpiece, and depositing at least one second insulating layer over the first insulating layer. The at least one second insulating layer and the first insulating layer are patterned with a pattern for at least one MIM capacitor, and a first conductive layer is deposited over the patterned at least one second insulating layer and the patterned first insulating layer. A dielectric layer is deposited over the first conductive layer, a second conductive layer is deposited over the dielectric layer, and the second conductive layer, the dielectric layer and the first conductive layer are removed from a top surface of the top at least one second insulating layer. The second conductive layer, the dielectric layer and the first conductive layer in the at least one MIM capacitor pattern comprises at least one MIM capacitor, and the first conductive layer extends completely to the top surface of the top at least one second insulating layer.

In accordance with another preferred embodiment of the present invention, a method of manufacturing a MIM capacitor includes providing a workpiece, depositing a first insulating layer over the workpiece, depositing a second insulating layer over the first insulating layer, and depositing at least one third insulating layer over the second insulating layer. The at least one third insulating layer, the second insulating layer and the first insulating layer are patterned with a pattern for at least one MIM capacitor, and a first conductive layer is deposited over the patterned second insulating layer and the patterned first insulating layer. A dielectric layer is deposited over the first conductive layer, and a second conductive layer is deposited over the dielectric layer. The second conductive layer, the dielectric layer and the first conductive layer are removed from a top surface of the at least one third insulating layer, wherein the second conductive layer, the dielectric layer and the first conductive layer in the at least one MIM capacitor pattern comprises at least one MIM capacitor.

In accordance with yet another preferred embodiment of the present invention, a method of manufacturing a semiconductor device includes providing a workpiece, the workpiece comprising a first region and a second region and having elements formed therein. A first insulating layer is deposited over the workpiece, and a plurality of first conductive regions are formed in the first insulating layer over at least the first region of the first insulating layer, the first conductive regions making electrical contact with elements in the workpiece. A second insulating layer is deposited over the first insulating layer and the first conductive regions, and at least one third insulating layer is deposited over the second insulating layer. The method includes patterning the at least one third insulating layer and the second insulating layer with a pattern for a plurality of MIM capacitors over the workpiece first region, exposing the first conductive regions, and depositing a first conductive layer over at least a top third insulating layer, the second insulating layer and the exposed first conductive regions. The first conductive layer and a top portion of the top third insulating layer is removed in a region between at least two adjacent MIM capacitor patterns, leaving a portion of the top third insulating layer recessed, and a dielectric layer is deposited over the first conductive layer and the recessed top third insulating layer. A second conductive layer is deposited over the dielectric layer, and the second conductive layer, the dielectric layer and the first conductive layer are removed from a top surface of the top third insulating layer, wherein the second conductive layer, the dielectric layer and the first conductive layer in the at least one MIM capacitor pattern comprises at least one MIM capacitor, and wherein depositing the second conductive layer comprises filling the recess in the top third insulating layer, coupling together the top plates of the at least two adjacent MIM capacitors.

Advantages of embodiments of the present invention include providing a method of forming MIM capacitors that is absent the bitline contact to top plate electrode shorting that is found in prior art MIM capacitor manufacturing methods. Capacitors with increased capacitance for a given layout area may be manufactured by forming the MIM capacitor in two or more insulating layers over the semiconductor device. The bottom electrode of the MIM capacitor may comprise a conductive plug formed in a first metallization layer and/or subsequent metallization layers, for example. Overlay process margins are improved for the semiconductor device.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A through 2M show a top view of a DRAM region of an embedded DRAM device having MIM capacitors formed in a DRAM region in two insulating layers of a semiconductor device in accordance with a preferred embodiment of the present invention, the two insulating layers comprising a via layer and an interconnect layer of the device;

FIGS. 3A through 3M show cross-sectional views of the embedded DRAM device at view A-A of FIGS. 2A through 2M;

FIGS. 4A through 4M show cross-sectional views of the embedded DRAM device at view B-B of FIGS. 2A through 2M;

FIG. 8 shows a cross-sectional view of a DRAM region shown in FIG. 7 rotated by 90 degrees.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, an embedded DRAM device. Embodiments of the present invention may also be applied, however, to other semiconductor applications that utilize MIM capacitors, for example.

Figure 1:
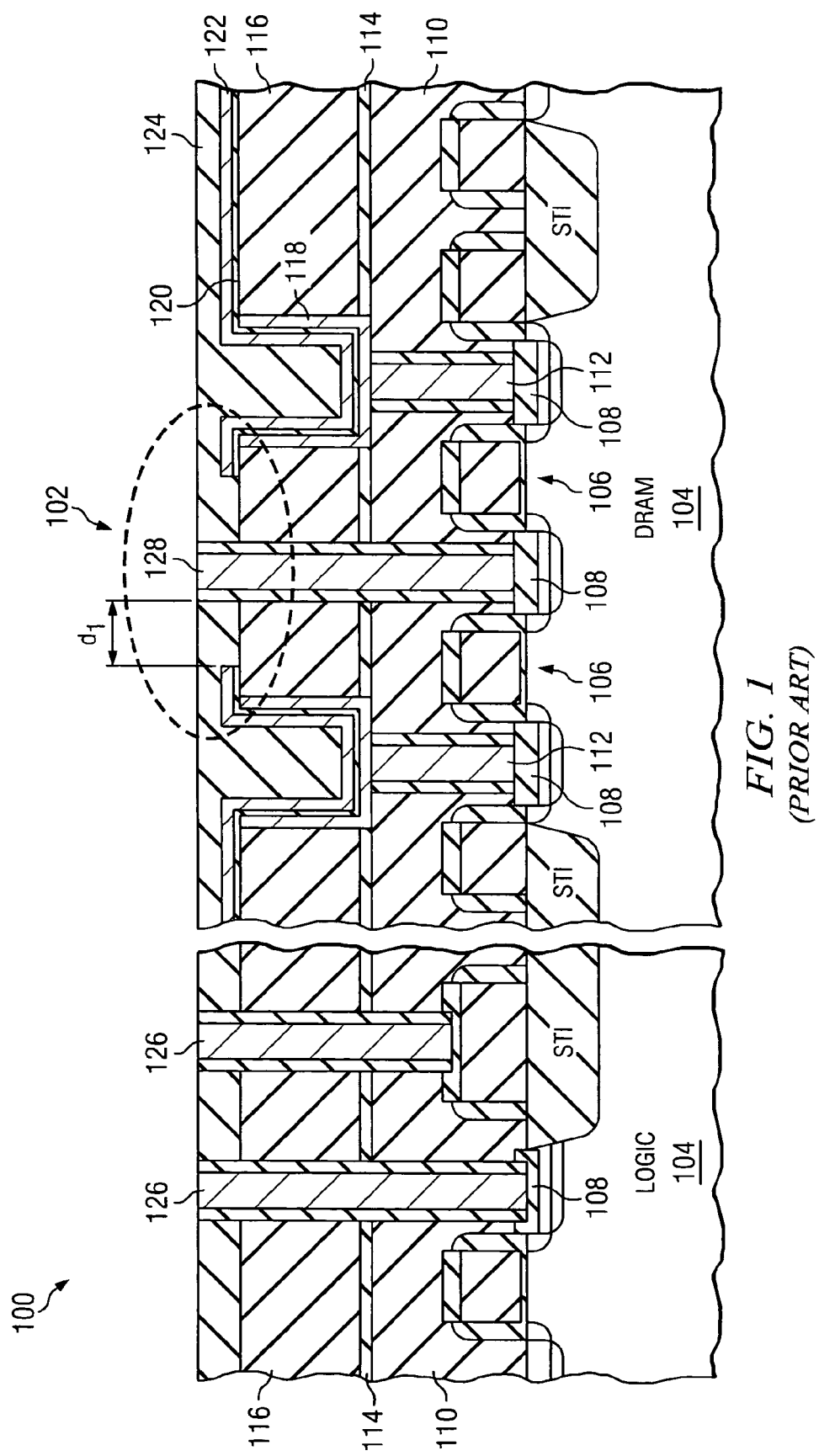
FIG. 1 shows a cross-sectional view of a prior art MIM capacitor formed in an embedded DRAM device in a single interconnect layer of the device.
Figure 2A:
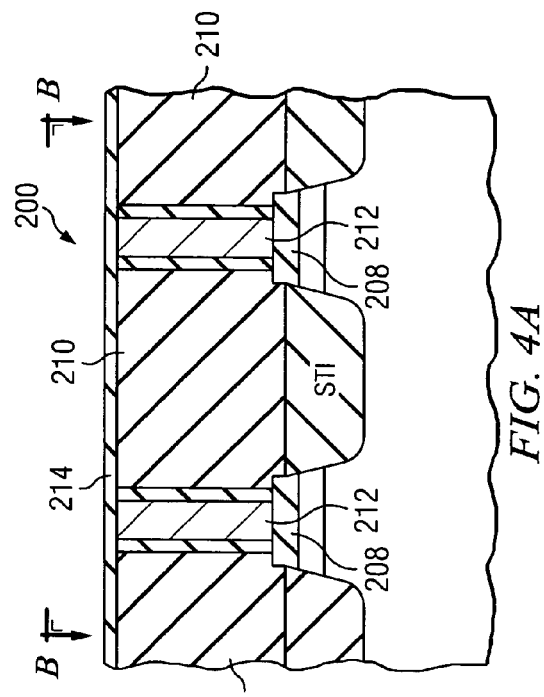
Figure 4A:
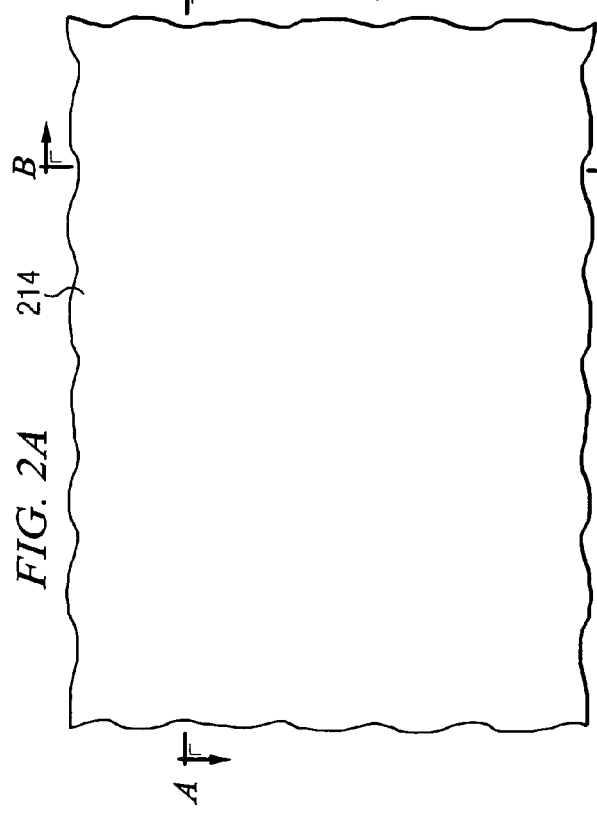
Figure 3A:
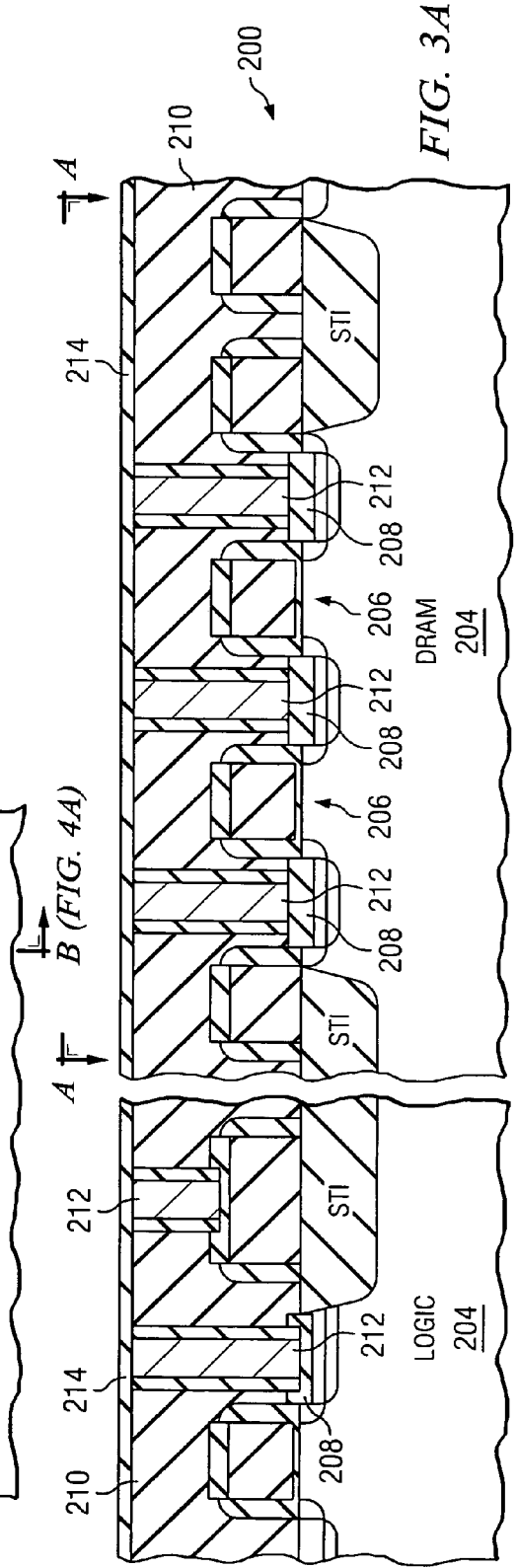

FIG. 2A shows a top view of the semiconductor device 200 in accordance with a preferred embodiment of the present invention. At this stage of manufacturing, a first stop layer 214 is disposed over the top surface of a workpiece 204 (see FIG. 3A) so that no features are visible at this point. FIG. 3A shows a cross-sectional view of the semiconductor device 200 of FIG. 2A at view A-A. FIG. 4A shows a cross-sectional view of the semiconductor device 200 at view B-B of FIG. 2A, which is a view of FIG. 3A rotated by 90 degrees.

Referring to the cross-sectional view A-A of FIG. 2A shown in FIG. 3A, a workpiece 204 is provided. The workpiece 204 comprises a logic region and a DRAM region, as shown. There may be a plurality of logic regions and DRAM regions formed in the workpiece 204, although only one logic region and DRAM region is shown in FIG. 3A. A plurality of elements and various circuit components may be formed in the logic region, as shown. Likewise, transistors 206 which may comprise access transistors for the DRAM devices of the DRAM region have been formed in and over the workpiece 204. The workpiece 204 also includes bitlines 208 that are used to make electrical connection to the transistors 206 and other components formed in the workpiece 204, not shown. Some of the transistors 206 and other components may be separated from adjacent transistors or components by shallow trench isolation (STI) regions.

A first insulating layer 210 is formed over the workpiece 204. The first insulating layer 210 may comprise an oxide or other dielectric material, for example. The first insulating layer 210 may comprise $SiO_2$, high density plasma (HDP) oxide, or plasma-enhanced tetraethoxysilate (PETEOS), as examples, deposited in a thickness of about 5000 to 8000 Angstroms, for example. The first insulating layer 210 is patterned with a pattern for first contact plugs, and then a conductive material is deposited in the pattern to form first conductive plugs 212 to make electrical connection between components that will be formed in subsequent dielectric layers to the underlying bitlines 208 in the DRAM region and to other components in the logic region, as shown. The pattern for the first conductive plugs may comprise a circular, square, or rectangular pattern, or alternatively, the contact plug patterns may comprise other shapes such as a rhombus or ellipse, as examples.

The first conductive plugs 212 may be formed by depositing a conductive barrier layer over the first insulating layer 210, and filling the patterned first insulating layer 210 over the conductive barrier layer with a conductive material such as tungsten, or other metals, as examples. The conductive barrier layer may comprise Ti and/or TiN, for example. Excessive amounts of the conductive material may be removed from the top surface of the first insulating layer 210 by a chemical-mechanical polish (CMP) process, for example. The first conductive plugs 212 may be formed in a single damascene process, for example. A first stop layer 214 is deposited or formed over the first insulating layer 210, as shown. The first stop layer 214 may comprise a thickness of about 300 Angstroms and may comprise a nitride such as $Si_3N_4$, SiC, SiON, TiN, or other dielectric materials, as examples.

Figure 3B:
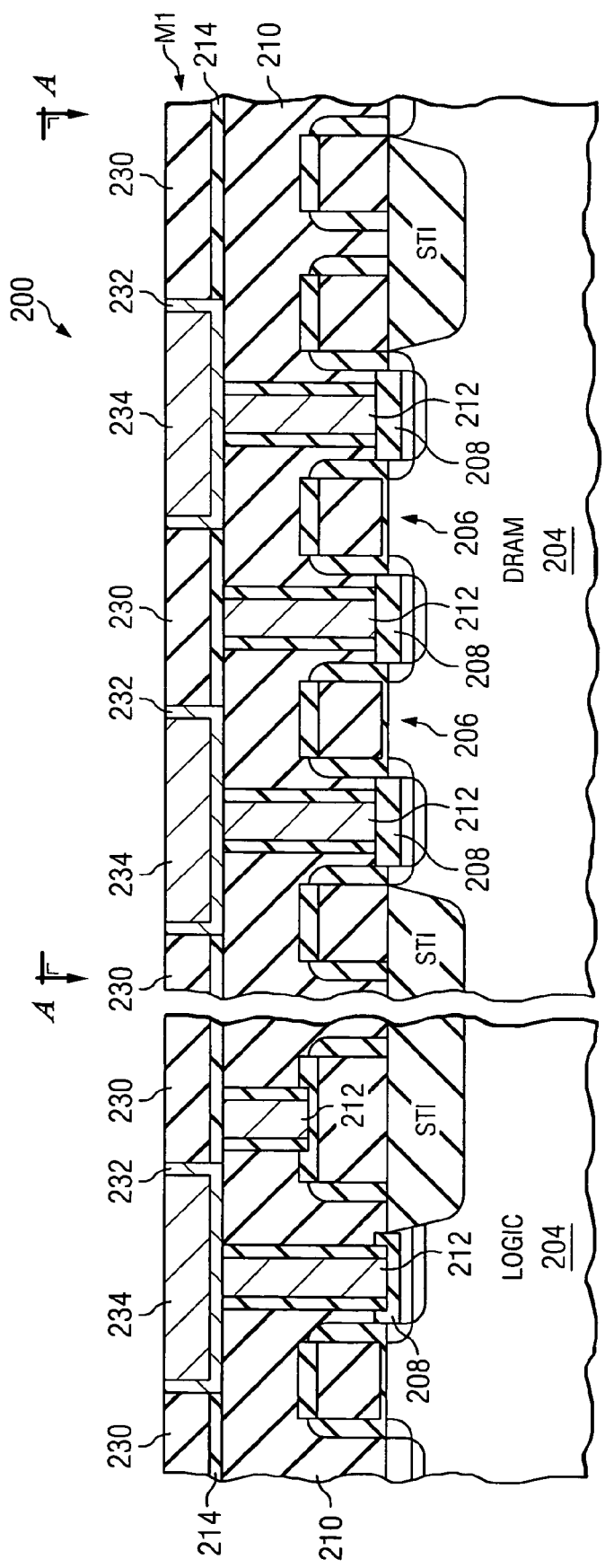

In accordance with a preferred embodiment of the present invention, a portion of a MIM capacitor bottom plate is formed in a subsequently deposited insulating layer. For example, a second insulating layer 230 which may comprise an oxide, a low dielectric constant material, or a similar dielectric material as used for the first insulating layer 210, is deposited over the first stop layer 214, as shown in FIG. 3B. The second insulating layer 230 may comprise $SiO_2$, borophosphosilicate glass (BPSG), tetraethoxysilate (TEOS), HDP oxide, spin on glass (SOG), undoped silicate glass (USG), fluorinated silicate glass (FSG), or Black Diamond™ manufactured by Applied Materials, as examples. Alternatively, the second insulating layer 230 may comprise other insulating materials. The second insulating layer 230 preferably comprises a thickness of about 4000 Angstroms, although alternatively, the second insulating layer 230 may comprise a thickness of about 2000 to 6000 Angstroms, as examples. The second insulating layer 230 preferably comprises a metallization or interconnect layer or level of the semiconductor device 200. In this embodiment, the second insulating layer 230 is formed in a first (M1) interconnect layer of the semiconductor device 200.

Preferably using a single damascene process, as an example, the second insulating layer 230 and the first stop layer 214 are patterned with a pattern for second conductive plugs in the logic region and the DRAM region. The pattern for the second conductive plugs may comprise a circular, square, or rectangular pattern, or alternatively, the second conductive plug patterns may comprise other shapes such as a rhombus or ellipse, as examples.

Figures 2B, 4B:
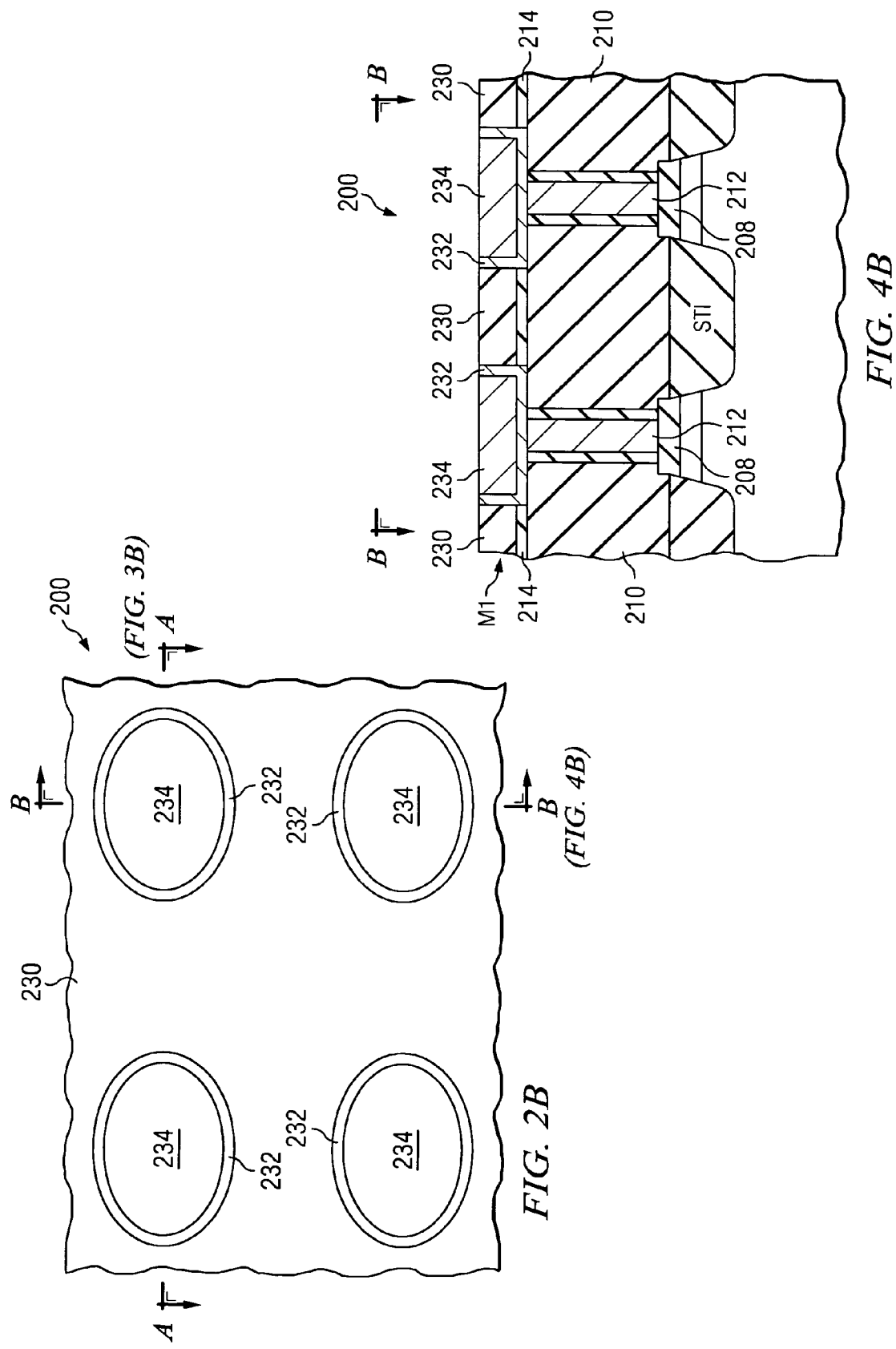

An optional first conductive barrier layer 232 may be deposited over the patterned second insulating layer 230 and first stop layer 214. The first conductive barrier layer 232 preferably comprises Ta, TaN, WN, Ti, TiN, or combinations thereof, as examples, although alternatively, the first conductive barrier layer 232 may comprise other materials. The first conductive barrier layer 232 may comprise a thickness of about 300 Angstroms, for example. A first conductive material 234 is then deposited over the first conductive barrier layer 232, as shown, to fill the pattern for conductive plugs in the second insulating layer 230 and first stop layer 214. The first conductive material 234 preferably comprises copper, and may alternatively comprise aluminum, copper, tungsten, polysilicon, or combinations thereof, for example. The first conductive material 234 may alternatively comprise other conductive materials. Excess amounts of the first conductive material 234 and the first conductive barrier layer 232 are removed from the top surface of the second insulating layer 230 using a CMP process, for example, although other etch processes may alternatively be used. The first conductive material 234 and first conductive barrier layer 232 comprise second conductive plugs 232/234. A top view of the semiconductor device 200 at this stage of manufacturing is shown in FIG. 2B, and a cross-sectional view of the DRAM region rotated by 90 degrees is shown in FIG. 4B.

Figure 3C:
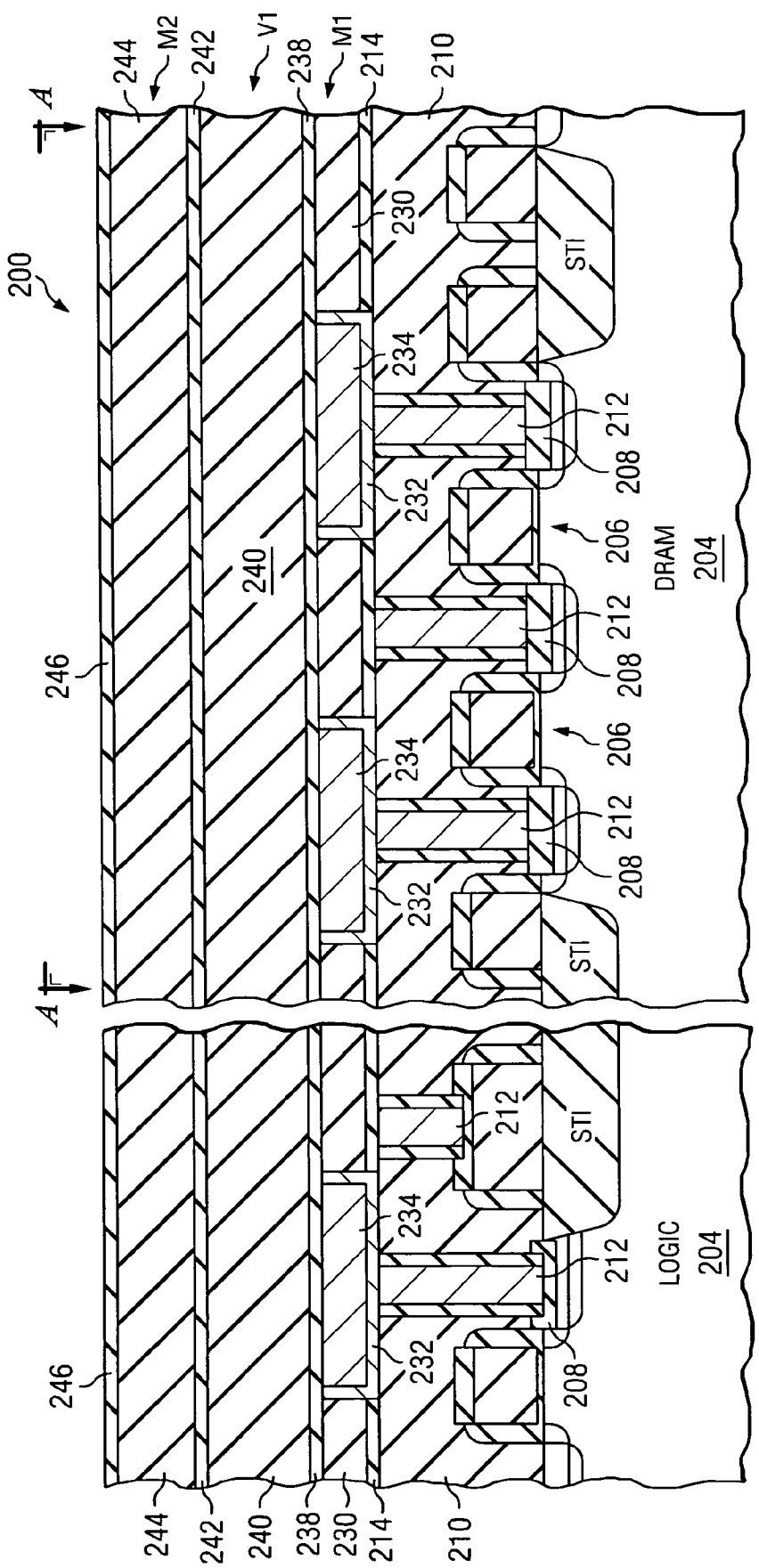

Shown in FIG. 3C, a second stop layer 238 is deposited over the second conductive plugs 232/234 and the second insulating layer 230. A third insulating layer 240 is deposited over the second stop layer 238. A third stop layer 242 is deposited over the third insulating layer 240. A fourth insulating layer 244 is deposited over the third stop layer 242, and a fourth stop layer 246 is deposited over the fourth insulating layer 244. The stop layers 238, 242, and 246 preferably comprise silicon nitride or other dielectric material, and the third insulating layer 240 and fourth insulating layer 244 preferably comprise an oxide or other dielectric material. For example, the second stop layer 238, third stop layer 242, and fourth stop layer 246 may comprise a thickness of about 300 Angstroms and may comprise a nitride such as $Si_3N_4$, SiC, SiON, TiN, or other dielectric materials, and the third insulating layer 240 and fourth insulating layer 244 may comprise a thickness of about 5000 Angstroms and may comprise may comprise $SiO_2$, BPSG, TEOS, HDP oxide, SOG, USG, FSG, Black Diamond™, or other insulating materials. The third insulating layer 240 preferably comprises a via level or layer V1, and the fourth insulating layer 244 preferably comprises a second metallization or interconnect level or layer M2 of the semiconductor device 200. A top view of the semiconductor device 200 is shown in FIG. 2C, and a cross-sectional view of the DRAM region rotated by 90 degrees from the view of FIG. 3C is shown in FIG. 4C.

Figure 3D:
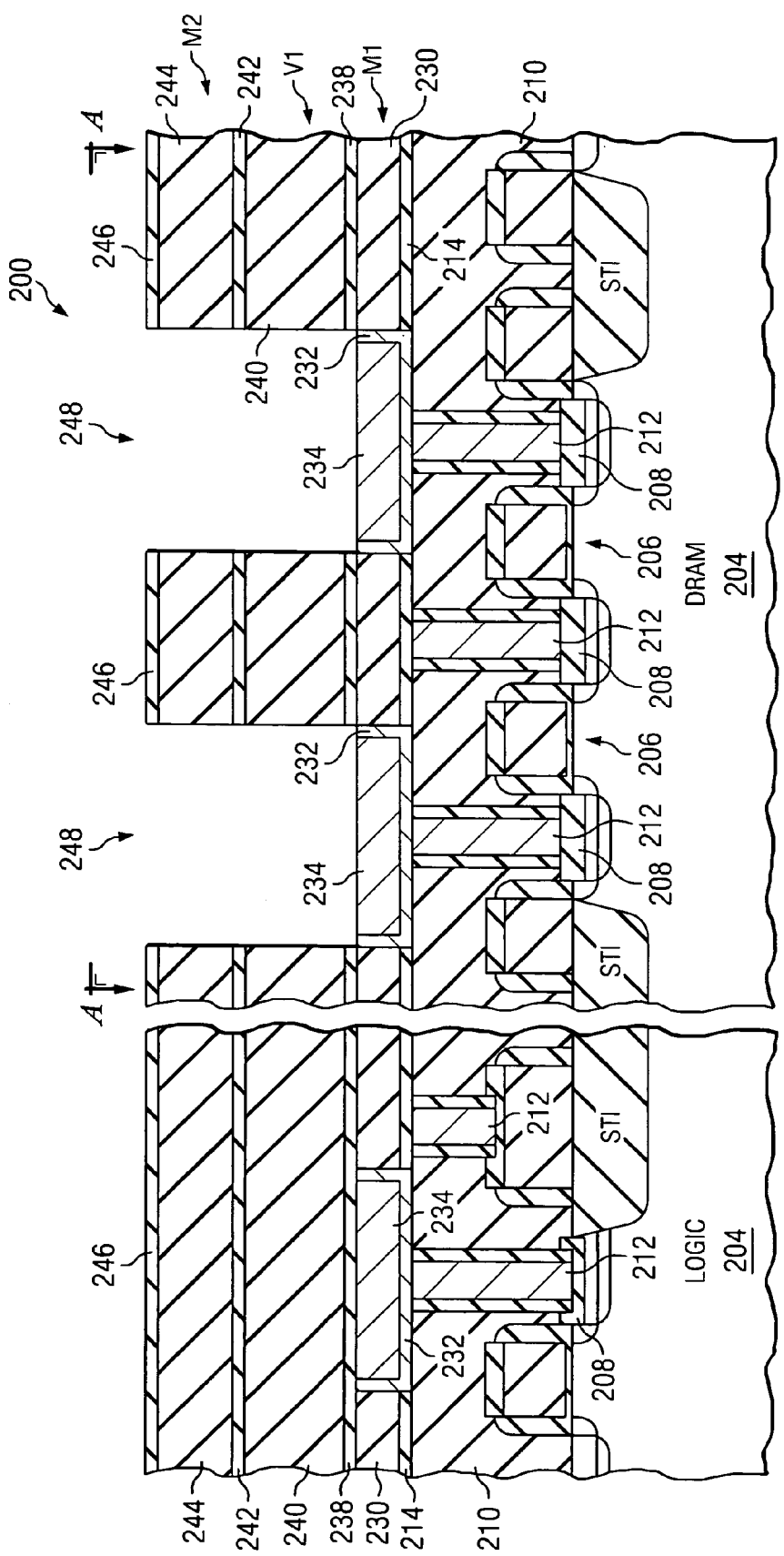

The fourth stop layer 246, fourth insulating layer 244, third stop layer 242, third insulating layer 240, and the second stop layer 238 are patterned using lithography (e.g. a photoresist is deposited, patterned and developed, and the photoresist is used as a mask while the insulating layers 246, 244, 242, 240, and 238 are etched) with the pattern 248 for a plurality of MIM capacitors, as shown in FIG. 3D. The pattern 248 for the MIM capacitors may comprise a circular, square, or rectangular pattern, or alternatively, the MIM capacitor pattern 248 may comprise other shapes such as a rhombus or ellipse, as examples. The pattern 248 for the MIM capacitors preferably extends completely through the entire thicknesses of the fourth stop layer 246, fourth insulating layer 244, third stop layer 242, third insulating layer 240, and the second stop layer 238, leaving the top surface of the second conductive plugs 232/234 exposed. The pattern 248 preferably comprises at least one MIM capacitor, and may comprise a pattern for the storage nodes of an array of memory devices, the array having a dimension of 2×1 or greater, for example. A top view of the semiconductor device 200 is shown in FIG. 2D, and a cross-sectional view of the DRAM region rotated by 90 degrees is shown in FIG. 4D.

Figures 2E, 4E:
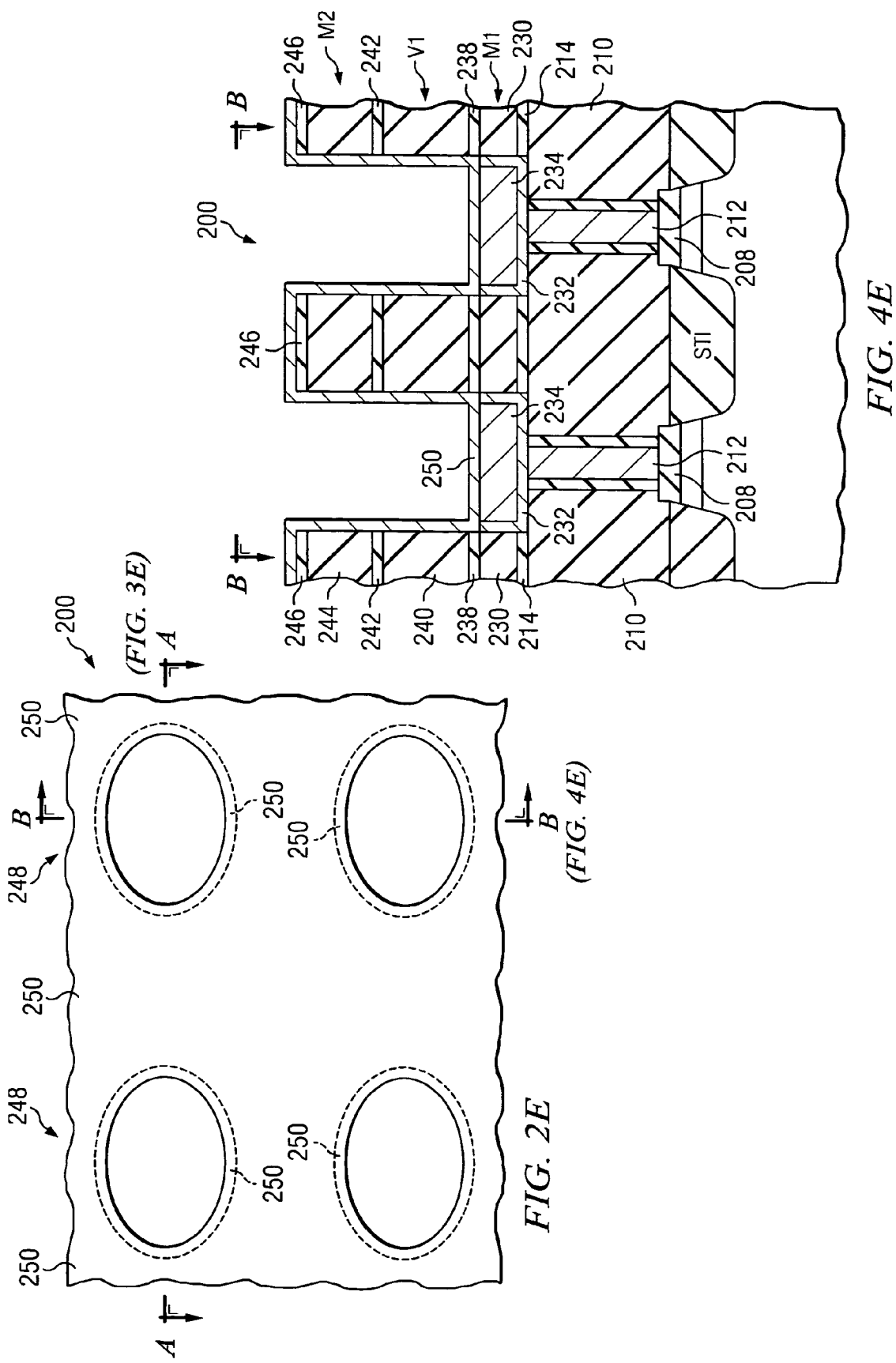
Figure 3E:
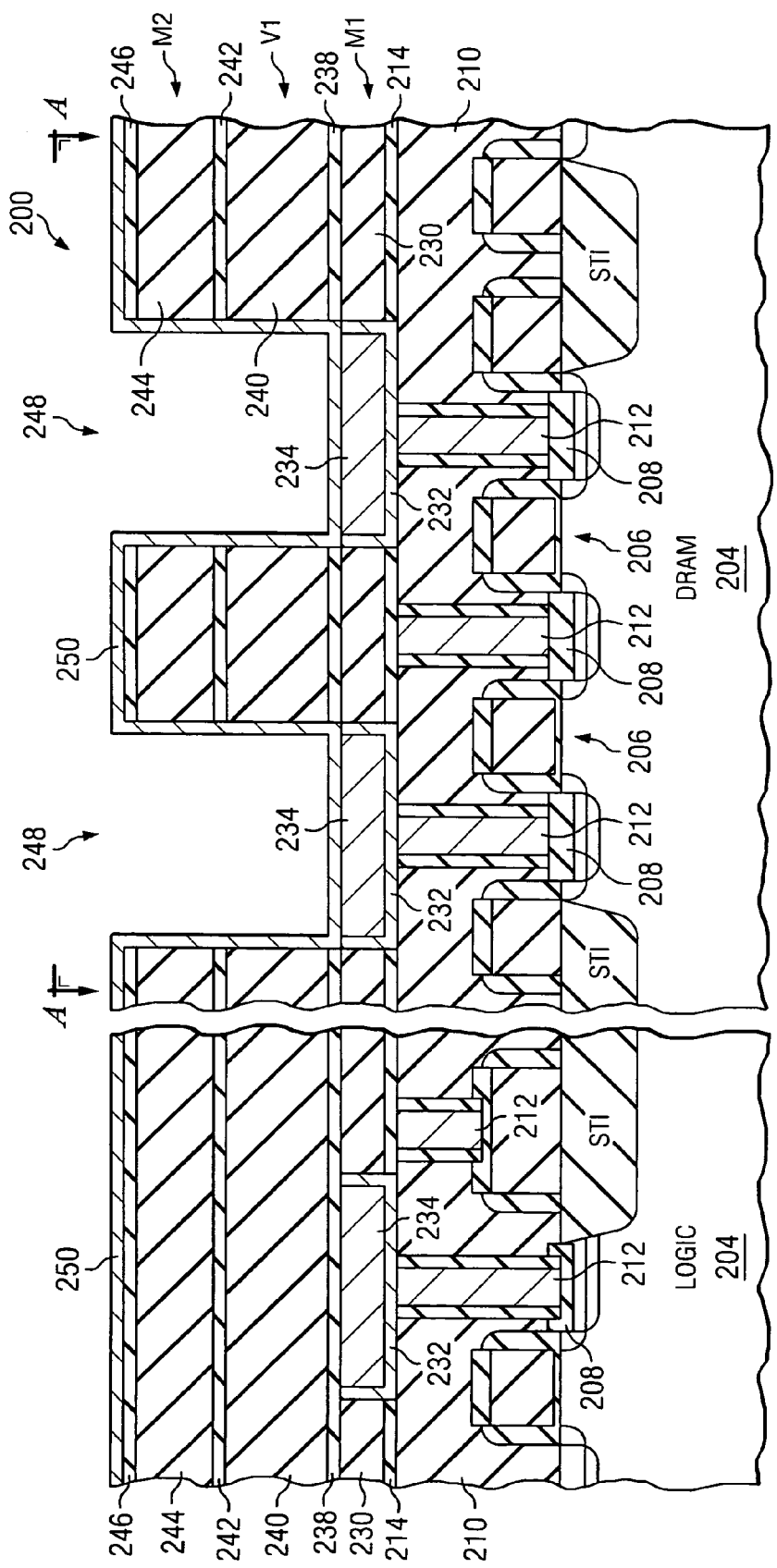

A conductive material layer 250 is deposited over the patterned fourth stop layer 246, fourth insulating layer 244, third stop layer 232, third insulating layer 240, and second stop layer 238, as shown in FIG. 3E. The conductive material layer 250 preferably comprises TiN or TaN. Alternatively, the conductive material layer 250 may comprise a refractory metal, TiN, TaN, Ta, TaSiN, TiW, NiCr, MoN, Ru, WN, WSi, Cu, Al, W, Ti, Ta, Co, N, Ni, Mo, other metals, combinations thereof, or polysilicon, as examples. The conductive material layer 250 preferably comprises a thickness of about 50 to 1000 Angstroms, for example. The conductive material layer 250 is a part of the bottom electrode of the MIM capacitors, to be described further herein. Preferably, the conductive material layer 250 makes electrical contact to the top surface of the second conductive plugs 232/234. A top view of the semiconductor device 200 is shown in FIG. 2E, and a cross-sectional view of the DRAM region rotated by 90 degrees is shown in FIG. 4E.

Figure 3F:
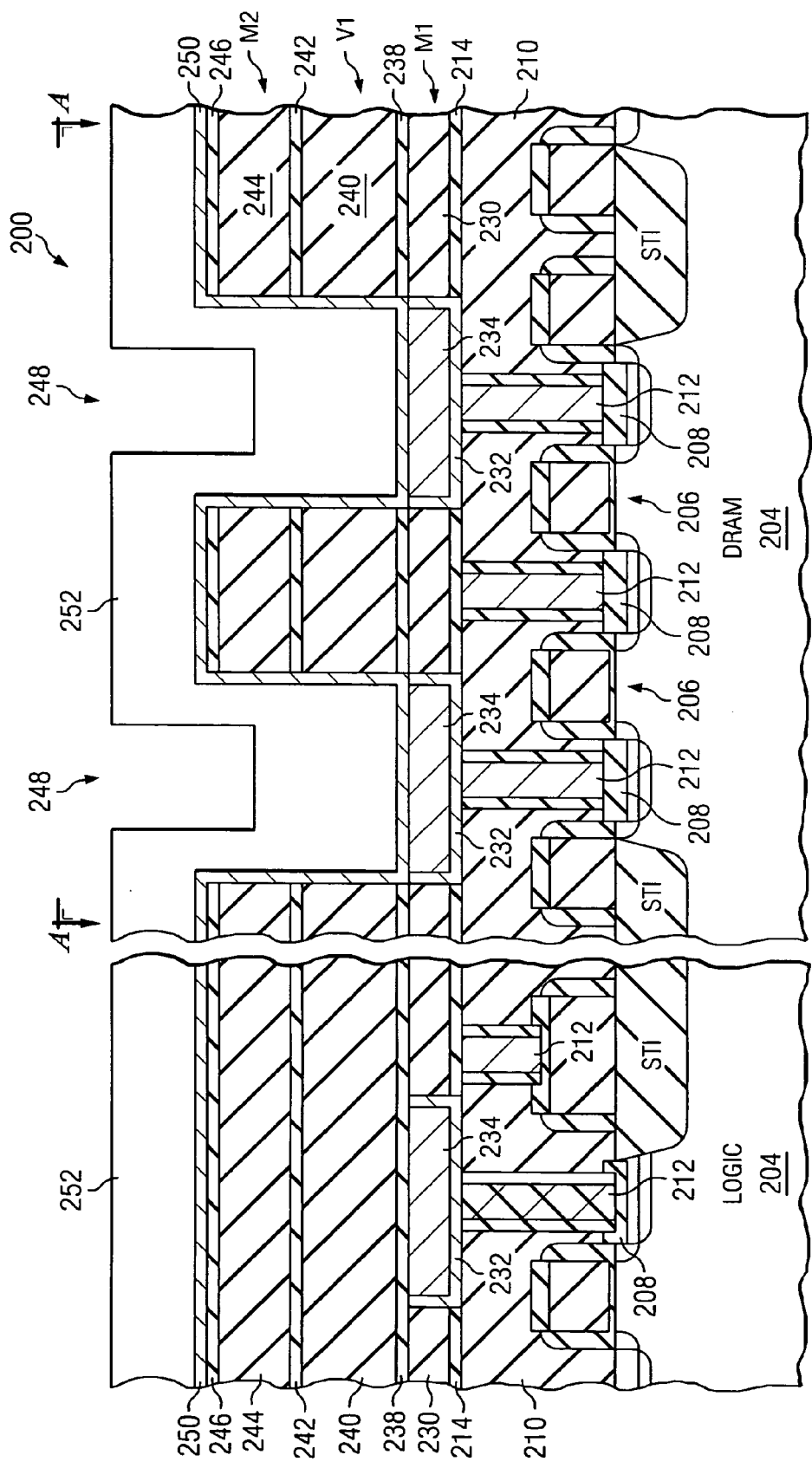

A layer of photoresist 252 is deposited over the conductive material layer 250, as shown in FIG. 3F. The photoresist 252 is conformal and thus substantially conforms to the pattern or topography of the workpiece 204 at this point in the fabrication process, as shown. The photoresist 252 is patterned with a pattern 253 between at least two adjacent MIM capacitors, as shown. The pattern 253 may be formed in a central region of the MIM capacitors, as shown in the top view in FIG. 2F. For example, the pattern 253 may comprise a trench over a portion of an entire row or column or over part of a row or column of MIM capacitors in the MIM capacitor array, as can be seen in the top view shown in FIG. 2F. The photoresist 252 is exposed and developed to remove portions of the photoresist 252 from over portions of the MIM capacitors, as shown in view B-B in FIG. 4F.

Figure 3G:
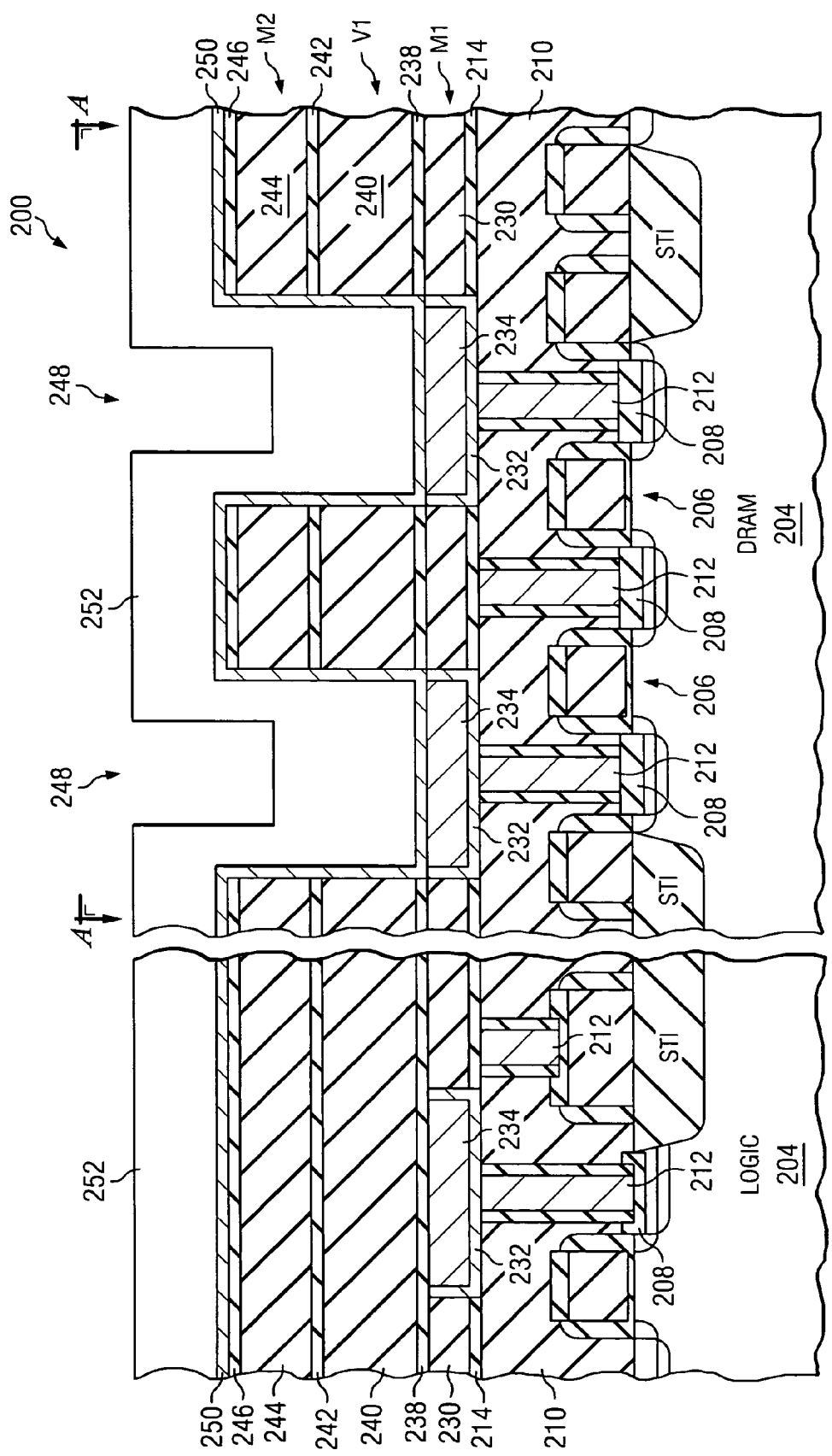
Figures 2H, 4H:
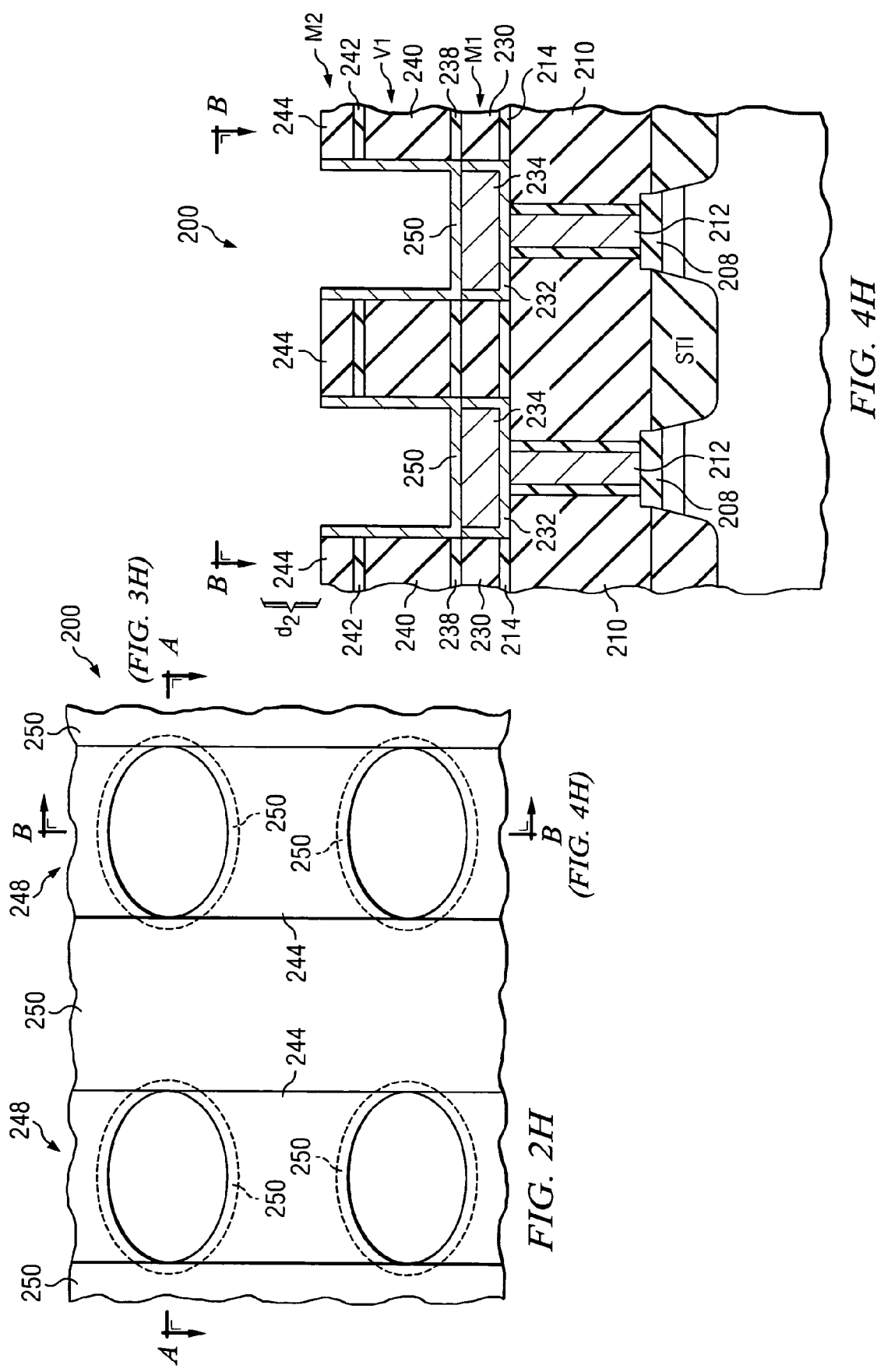
Figure 3H:
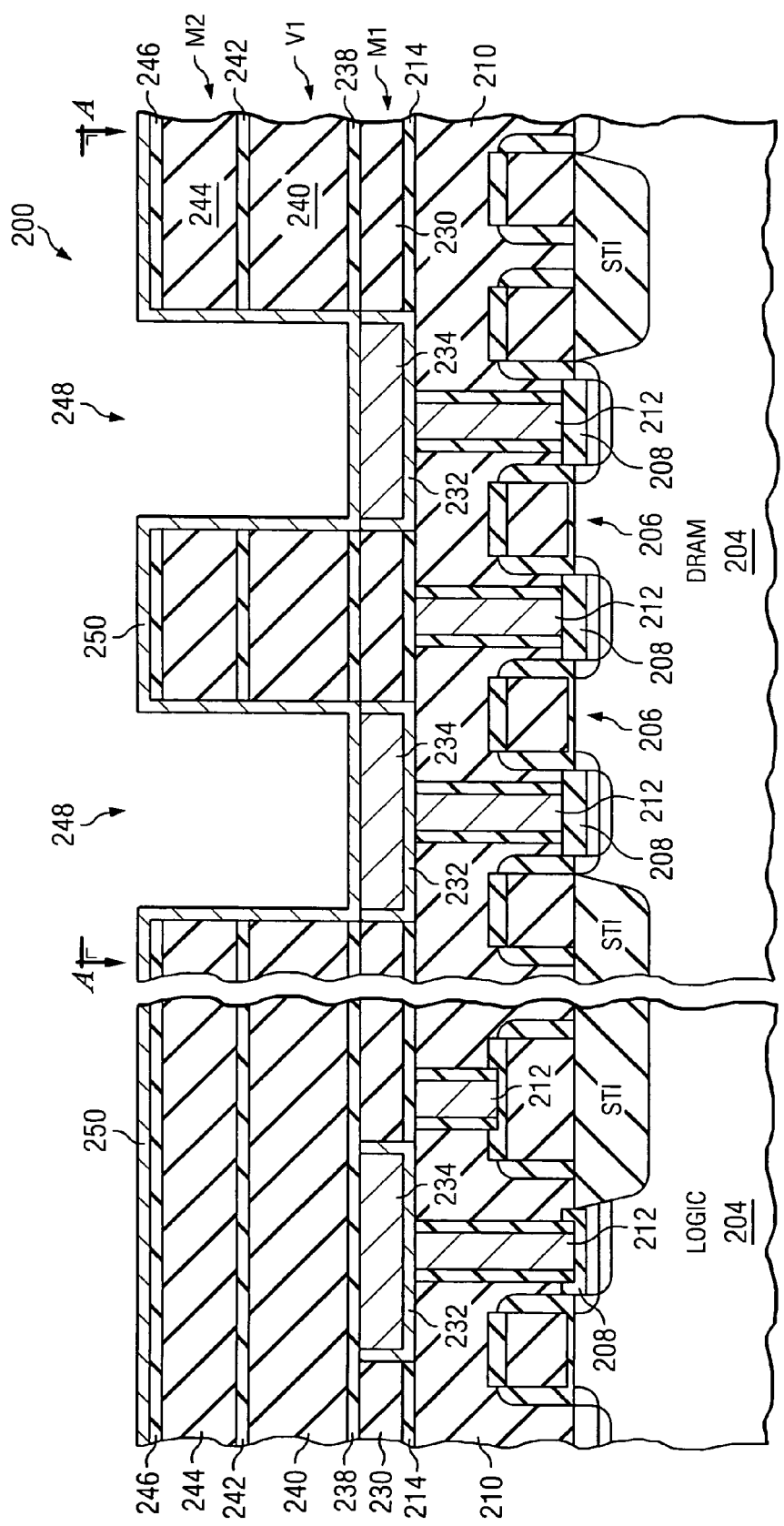

Next, with portions of the photoresist 252 left remaining over the logic region and portions of the DRAM region such as shown in FIG. 3G and a top view in FIG. 2G, the conductive material layer 252, the fourth stop layer 246 and the fourth insulating layer 244 are etched in areas not protected by photoresist 252, as shown in FIG. 4G. The conductive material layer 250 and the fourth stop layer 246 are removed completely in the patterned region 253, and a top portion of the fourth insulating layer 244 is removed between at least two adjacent MIM capacitor patterns. The amount of the fourth insulating layer 244 that is removed is predetermined and comprises a distance $d_2$, as shown in FIG. 4G. The distance $d_2$ may comprise about 500 to 5000 Angstroms, for example. The etch process to recess the fourth insulating layer 244 may comprise a timed etch, for example. Portions of the workpiece 204 that are covered by the photoresist 252 remain unetched during the etching of the fourth stop layer 246 and the fourth insulating layer 244. The photoresist 252 is removed, as shown in FIGS. 2H, 3H, and 4H.

Figure 3J:
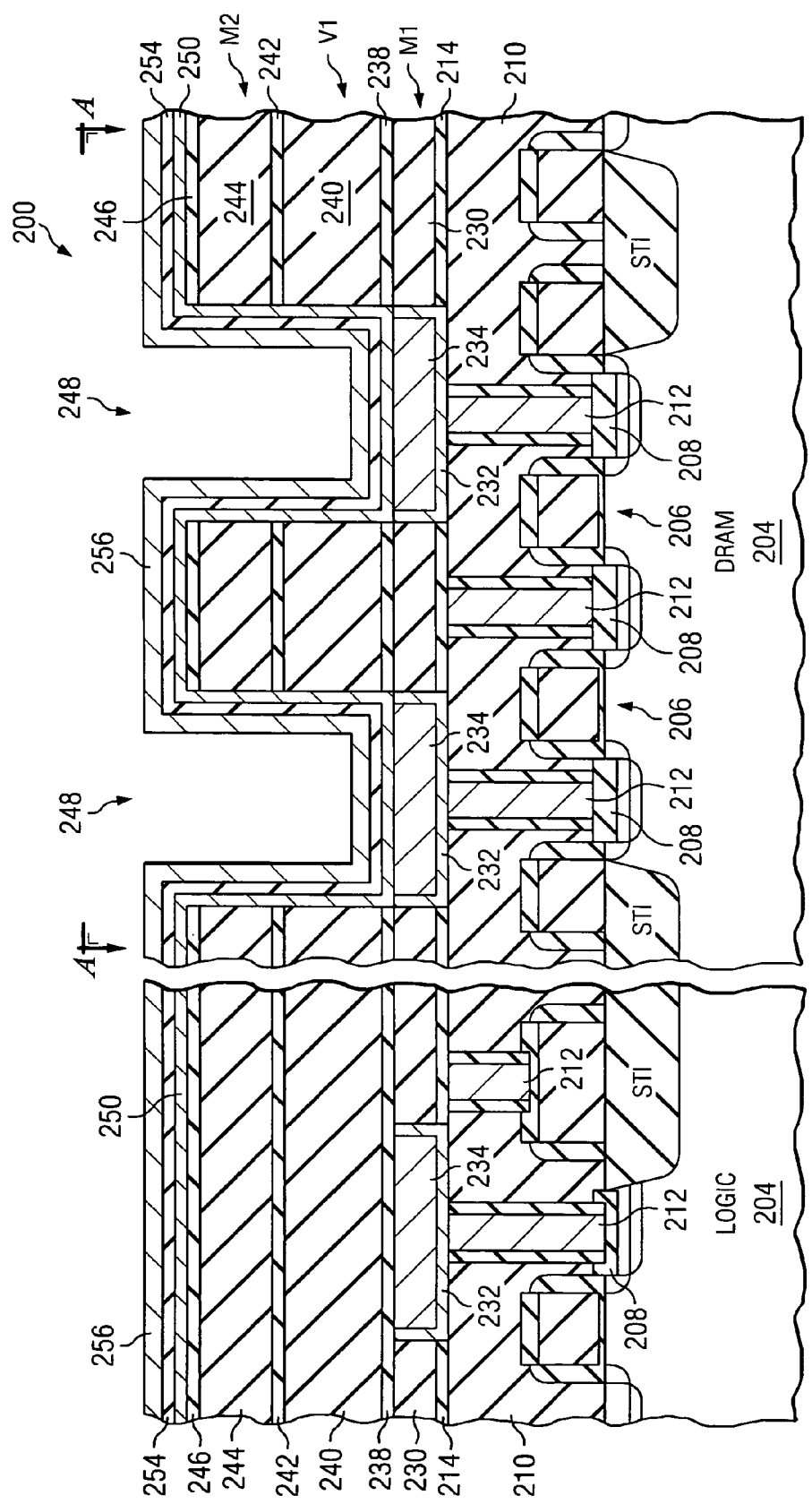

A dielectric layer 254 is deposited over the conductive material layer 250 in the logic region and the DRAM region, as shown in FIG. 3J. The dielectric layer 254 is deposited over the conductive material layer 250 in the MIM capacitor pattern and over the recessed fourth insulating layer 244, as shown in FIG. 4J. Preferably, the dielectric layer 254 is substantially conformal. The dielectric layer 254 will function as the MIM capacitor dielectric material. The dielectric layer 254 preferably comprises a high dielectric constant insulating layer, such as $Ta_2O_5$. Alternatively, the dielectric layer 254 may comprise $Al_2O_3$ or $SrTiO_3$, or other dielectric materials, as examples. The dielectric layer 254 may comprise a high dielectric constant material. In one embodiment, the dielectric layer 254 preferably comprises Al, Si, O, N, Ti, Ta, lead-zirconate-titanate (PZT), barium strontium titanate (BST), $Ta_2O_5$, $Al_2O_3$, $SiO_2$, other dielectric materials, or combinations thereof. The dielectric material 254 preferably comprises a thickness of about 10 to 500 Angstroms, for example.

A top plate electrode material 256 is deposited over the dielectric layer 254, also shown in FIGS. 2J, 3J, and 4J. The top plate electrode material 256 preferably comprises a conductor such as TiN, TaN, Ru, or other conductive materials or metals, as examples. In one embodiment, the top plate electrode material 256 comprises a refractory metal, TiN, TaN, Ta, TaSiN, TiW, NiCr, MoN, Ru, WN, WSi, Cu, Al, W, Ti, Ta, Co, N, Ni, Mo, other metals, combinations thereof, or polysilicon, as examples. The top plate electrode material 256 preferably comprises a thickness of about 50 to 1000 Angstroms, for example.

Figure 3K:
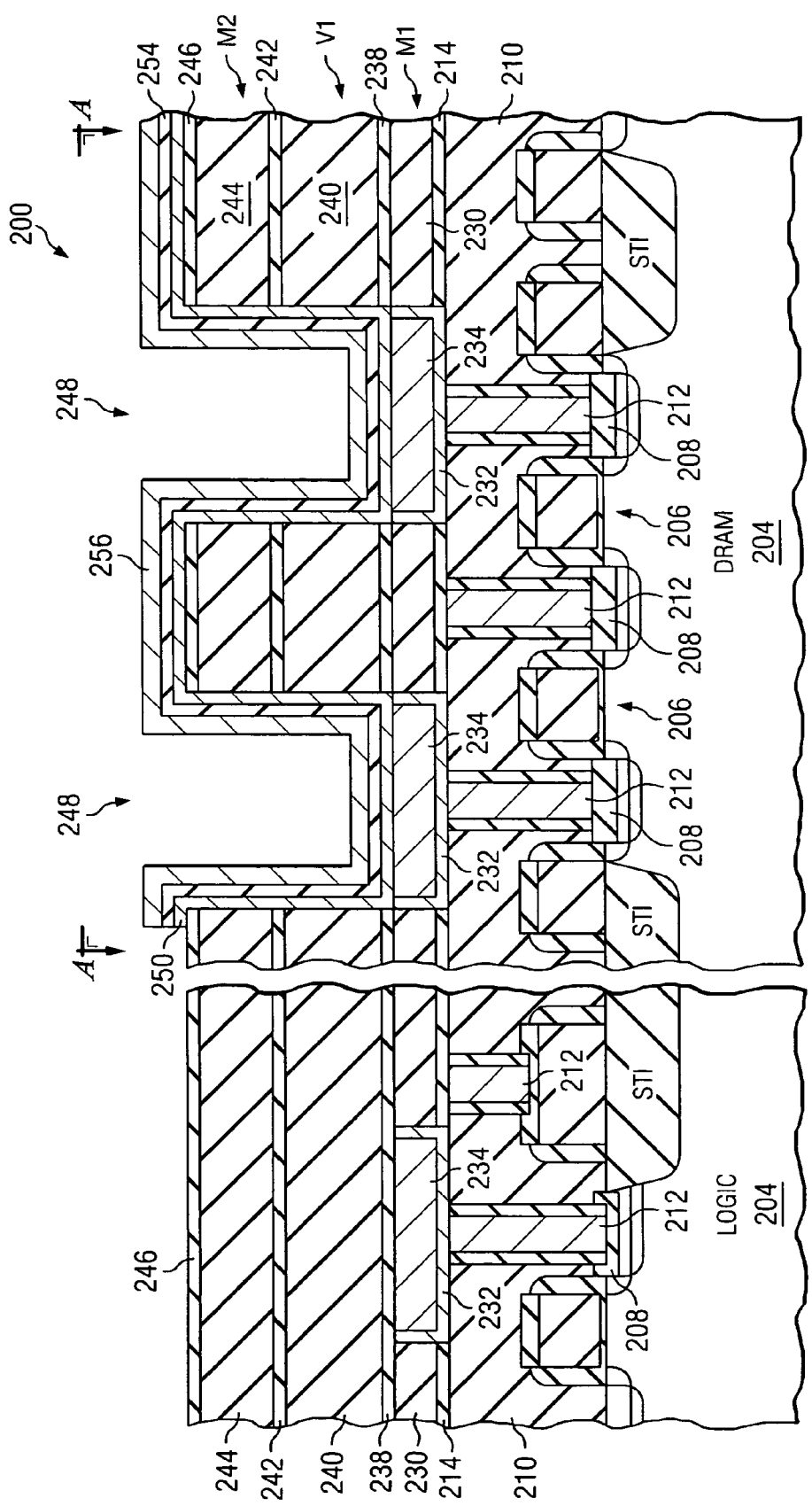

The top plate electrode material 256 and the dielectric layer 254 are removed from the logic region of the workpiece 204, as shown in FIG. 3K. This may be accomplished by depositing a photoresist over the entire workpiece 204, patterning the photoresist, and using the photoresist (not shown) as a mask to remove the top plate electrode material 256 and dielectric layer 254 from the logic region. A top view of the semiconductor device 200 is shown in FIG. 2K, and a cross-sectional view of the DRAM region rotated by 90 degrees from the view shown in FIG. 3K is shown in FIG. 4K.

Figure 3L:
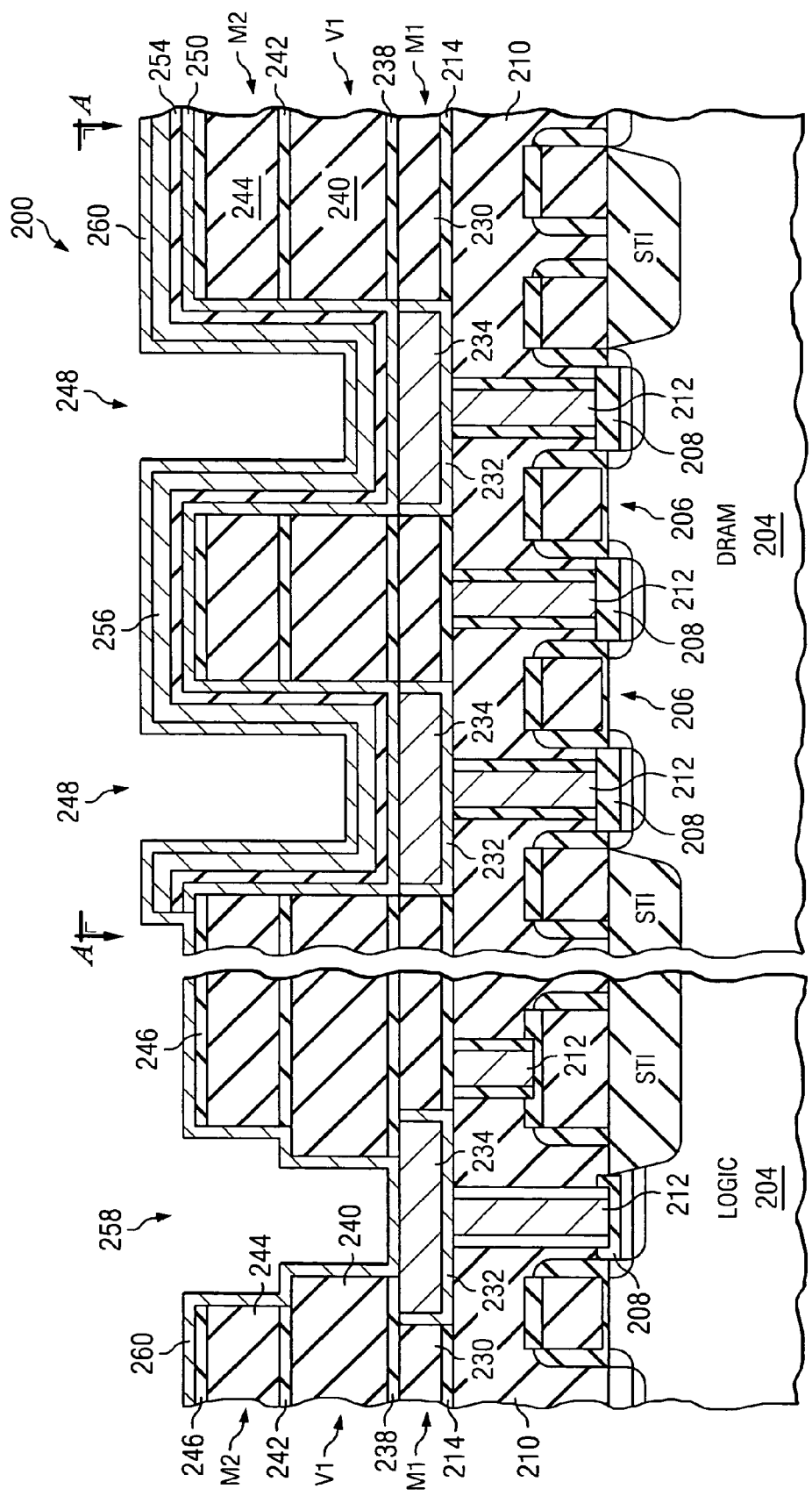

A dual damascene process is used to pattern the third insulating layer 240 and the fourth insulating layer 244 (and also stop layers 246, 242 and 238) in the logic region of the workpiece 204 with a dual damascene pattern 258, as shown in FIG. 3L. For example, a photoresist (not shown) may be deposited over the entire surface of the workpiece 204, and the photoresist may be patterned with a pattern for vias that will be formed in the third insulating layer 240 (via level V1). The via pattern is transferred to the third insulating layer 240, and then a second photoresist layer is deposited over the entire surface of the workpiece 204. The fourth insulating layer 244 in the logic region is then patterned with the pattern for conductive lines and/or contact plugs in the second metallization layer M2. The photoresist is then removed from the wafer. A dual damascene process is commonly used in the art and thus is not described in detail herein.

After the logic region is patterned for the desired via level and metallization level, a second conductive barrier layer 260 may be deposited over the top surface of the workpiece 204. In particular, the second conductive barrier layer 260 is deposited over the patterned fourth insulating layer 244, third insulating layer 240, the patterned stop layers 246, 242, and 238 in the logic region of the workpiece, as shown in FIG. 3L. The second conductive barrier layer 260 is deposited over the top plate electrode material 256 in the DRAM region of the workpiece 204, also shown in FIG. 3L. The second conductive barrier layer 260 may comprise Ta, TaN, WN, Ti, TiN, Ru, or combinations thereof, or other materials, as examples, deposited in a thickness of about 300 Angstroms. A top view of the semiconductor device 200 is shown in FIG. 2L, and a cross-sectional view of the DRAM region rotated by 90 degrees is shown in FIG. 4L.

Figure 3M:
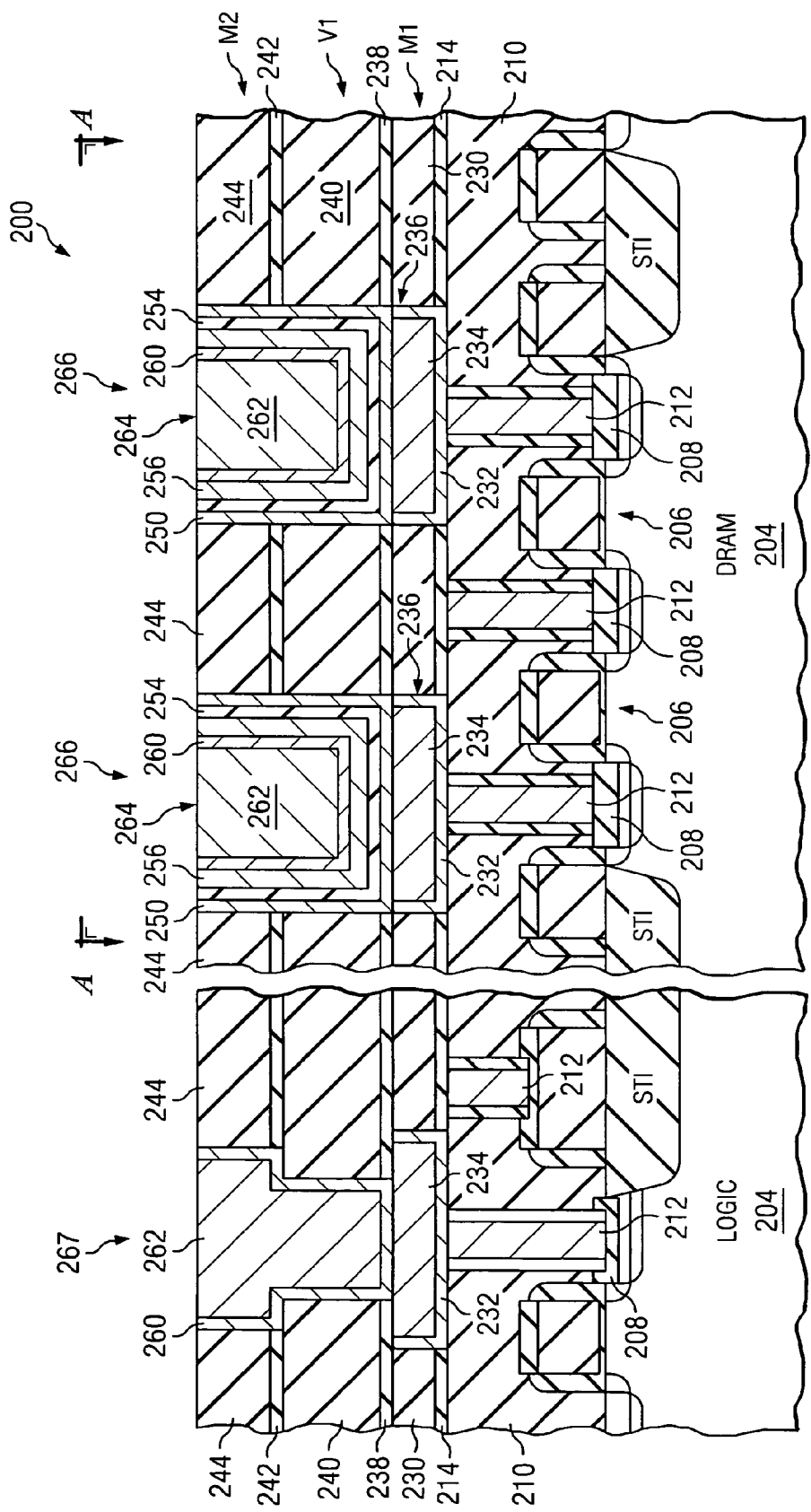

A second conductive material 262 is deposited over the second conductive barrier layer 260, as shown in FIGS. 2M, 3M, and 4M. Excess second conductive material 262 is removed from the top surface of the fourth insulating layer 244 using a CMP process or other process, as examples, forming a conductive plug 267. The fourth stop layer 246 may be removed during the CMP process, as shown. Note that the second conductive material 262 preferably fills the vias and conductive regions in the V1 and M2 layers of the third insulating layer 240 and fourth insulating layer 244, respectively, as shown in the logic region of FIG. 3M. The second conductive material 262 fills the MIM capacitor pattern in the DRAM region, as shown in FIGS. 3M and 4M. Advantageously, adjacent MIM capacitors 266 are connected together electrically by connecting region 265 that is formed in the recess in the top portion of the fourth insulating layer 244, as shown in FIG. 4M. A top view of the semiconductor device 200 at this stage in manufacturing is shown in FIG. 2M. Note that the recessed regions of the fourth insulating layer 244 create a trench that forms a connection between vertical rows of the MIM capacitors along their widest edge, as can be seen in FIG. 2M. Subsequent via layers and metallization layers may be deposited, patterned and filled to complete the manufacturing of the semiconductor device 200, not shown.

A novel MIM capacitor structure is formed in accordance with embodiments of the present invention. For example, shown in FIG. 3M in a cross-sectional view, the MIM capacitors 266 comprise a bottom plate electrode that includes the first conductive barrier layer 232, the first conductive material 234, and the conductive material layer 250. The MIM capacitors 266 comprise a top plate electrode 264 that includes the top plate electrode material 256, the second conductive barrier layer 260, and the second conductive material 262. Advantageously, a portion of the MIM capacitor bottom plate electrode 236 is formed in a metallization layer M1 of the semiconductor device 200. A portion of the top plate electrode 264 is formed during the fill process of the V1 and second metallization layer M2, for example, the same fill process of the dual damascene method that is used to pattern and fill the third insulating layer 240 and the fourth insulating layer 244. Therefore, the MIM capacitor fabrication process is integrated into already-existing portions of the fabrication process of the embedded DRAM device 200. Also, advantageously, because the top or fourth insulating layer 244 is recessed to create connecting regions 265 between the MIM capacitors 266, no additional metallization levels are required to make electrical connections between adjacent MIM capacitors 266.

Many semiconductor device applications comprise many levels of metallization. For example, six or more, and up to ten or twelve or more metallization layers may be required for complex integrated circuits. The MIM capacitor structure and method of manufacturing described herein may be utilized in a virtually unlimited number of insulating layers and metallization levels. Preferably, regardless of the number of metallization layers, the top insulating layer is recessed across a portion of adjacent MIM capacitors where electrical connection of adjacent MIM capacitors is required. The bottom electrode of the MIM capacitor may further comprise conductive regions formed in additional insulating layers of the semiconductor device.

Figure 5:
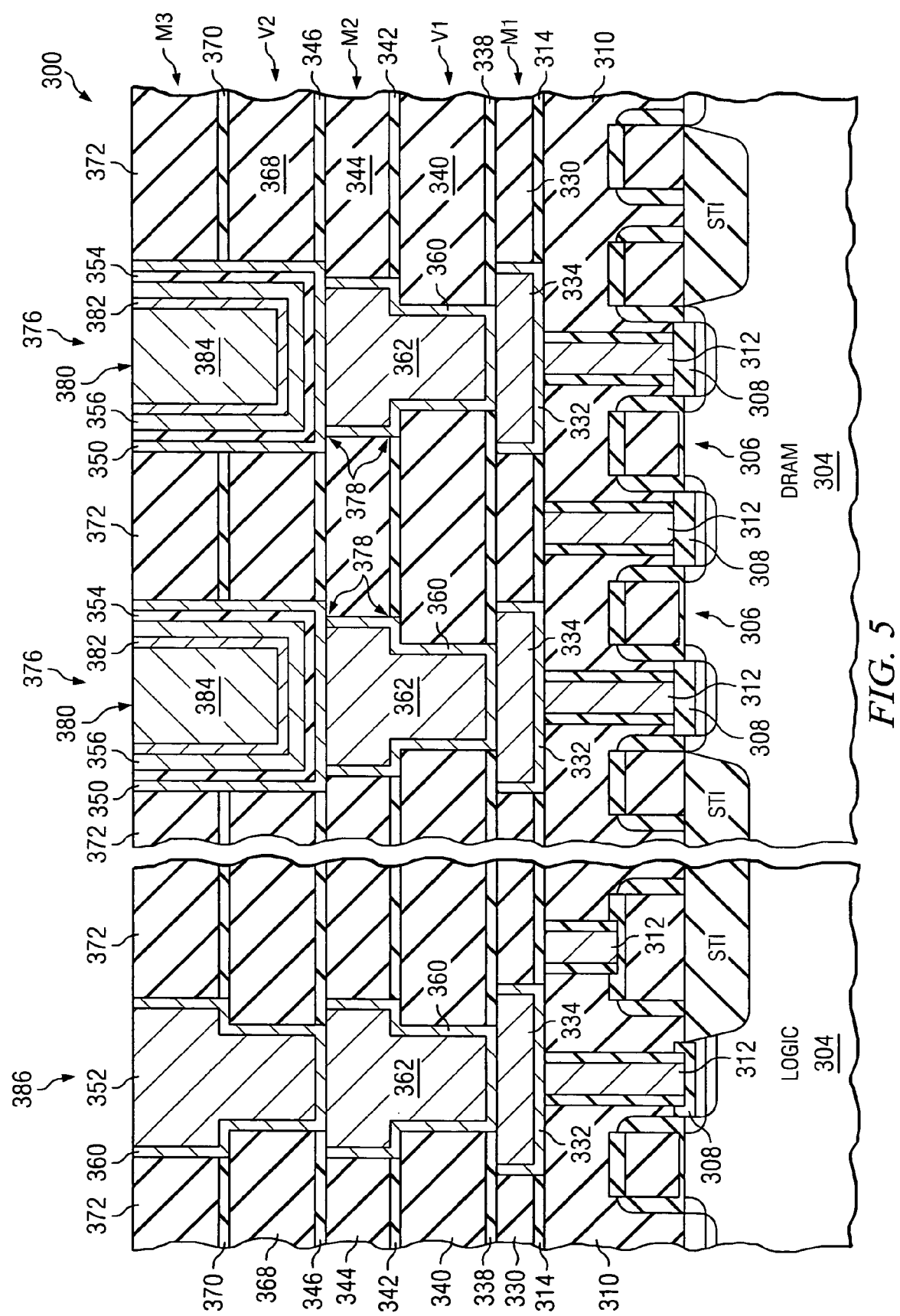
FIG. 5 shows a cross-sectional view of another preferred embodiment of the present invention, wherein contact plugs are formed in a first interconnect layer, a first via layer, and a second interconnect layer of a device, and wherein MIM capacitors are formed in a second via layer and a third interconnect layer of the device.

A second preferred embodiment of the present invention is shown in a cross-sectional view in FIG. 5. In this embodiment, wherein similar numbers are used for elements as were used to describe FIGS. 3A through 3M, again, the MIM capacitor bottom plate electrode includes a conductive region 332/334 that is formed in a first metallization layer M1, and the conductive region 332/334 comprises a first conductive barrier layer 332 and a first conductive material 334. In this embodiment, a MIM capacitor is not formed in the M2 and V1 levels, but rather, a MIM capacitor 376 is formed in the M3 and V2 levels.

The MIM capacitor 376 has a bottom plate 378 comprising a conductive material layer 350 and the conductive regions 332/334. The bottom plate 378 of the MIM capacitors 376 further includes a second conductive barrier layer 360 and a second conductive material 362 disposed between and electrically connecting the conductive material layer 350 and the conductive regions 332/334. The second conductive barrier layer 360 and the second conductive material 362 form conductive regions 360/362 that are formed in the V1 and M2 levels. When the vias and conductive regions are formed in the logic regions, in the third insulating layer 340 and the fourth insulating layer 344, a portion 360 and 362 of the bottom electrode 378 of the MIM capacitor is also formed.

In this process, a photoresist is not used to cover the DRAM regions of the workpiece during the V1 and M2 level fill. Rather, they are left uncovered so that the second conductive barrier layer may also line a dual damascene pattern that has been formed in the DRAM region in the third insulating layer 340 and the fourth insulating layer 344. Similarly, a second conductive material 362 is deposited over the entire wafer, and a CMP process is used to remove the excess second conductive material 362 and the excess second conductive barrier layer 360 from the top surface of the fourth insulating layer 344.

Then, a fifth insulating layer 368 is deposited over the fourth stop layer 346, a fifth stop layer 370 is deposited over fifth insulating layer 368, a sixth insulating layer 372 is deposited over the fifth stop layer 370, and a sixth stop layer (not shown) is deposited over the sixth insulating layer 372. The logic region remains covered while the sixth insulating layer 372, fifth insulating layer 368, and stop layers 370 and 346 are patterned with the MIM capacitor pattern, as described with reference to FIG. 3D, for example. To form the MIM capacitors 376, a conductive material layer 350 is deposited over the patterned sixth insulating layer 372, fifth stop layer 370, fourth insulating layer 368, and fourth stop layer 346. The conductive material layer 350 is removed, and a portion of at least the sixth insulating layer 372 is removed between at least two adjacent MIM capacitor patterns. A dielectric layer 354 is deposited over the conductive material layer 350 and the recessed portions of the sixth insulating layer 372 and a third conductive barrier layer 382 is deposited over the dielectric layer 354. A third conductive material 384 is deposited over the third conductive barrier layer 382, and excess portions of the third conductive material 384 and third conductive barrier layer 382 are removed from the top surface of the sixth insulating layer 372 using a CMP process.

Figure 6:
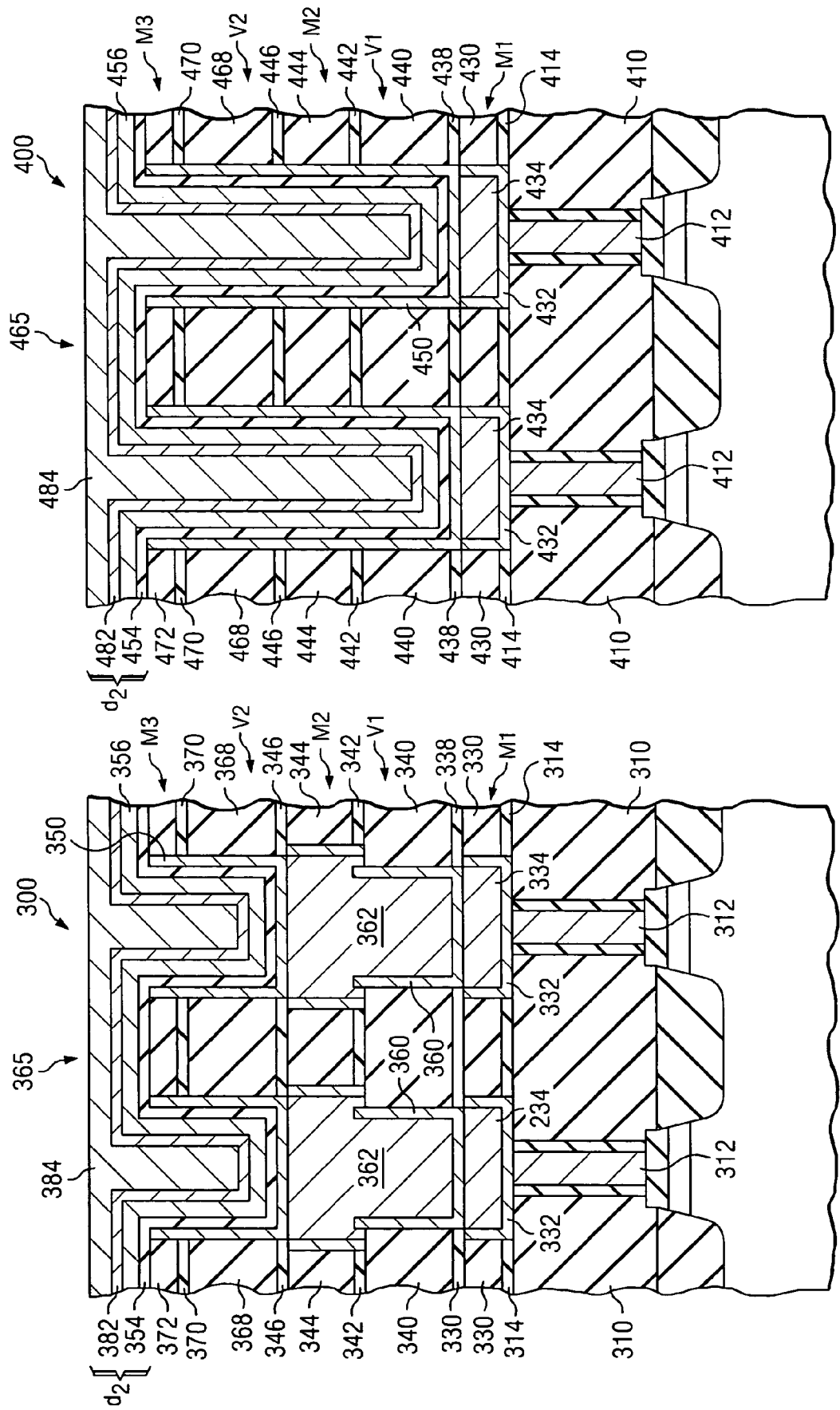
FIG. 6 shows a cross-sectional view of a DRAM region shown in FIG. 5 rotated by 90 degrees.

The MIM capacitors 376 comprise a bottom plate 378 that includes the first conductive barrier layer 332, first conductive material 334, second conductive barrier layer 360, second conductive material 362, and conductive material layer 350. The MIM capacitors 376 also include a top plate 380 that comprises the top plate electrode material 356, the third conductive barrier layer 382 and the third conductive material 384. A conductive plug 386 is formed in the logic region that extends through the metallization layers M1, M2 and M3, and the via layers V1 and V2, as shown. Advantageously, in this embodiment, a portion of the top or sixth insulating layer 332 may also be removed, providing connections between adjacent MIM capacitors, as shown in FIG. 6. FIG. 6 shows a cross-sectional view of the semiconductor device 300 shown in FIG. 5, rotated by 90 degrees in the DRAM region. As in the first embodiment, a top portion of the sixth insulating layer 372 is recessed by an amount $d_2$ so that when the third conductive material 384 is deposited and exposed to a CMP process, a portion of the third conductive material 384 and third conductive barrier layer 382 remains residing in connecting regions 365 between at least two adjacent MIM capacitors 376. This is an advantage because no additional metallization layers need be used to connect adjacent MIM capacitors 376. Furthermore, because the connecting regions 365 are formed in the top insulating layer 372, there is less chance of shorts to bitline contacts, which may be formed in subsequent manufacturing processes.

While a portion of the MIM capacitor 376 bottom plates 378 is formed in two metallization layers M1 and M2 (insulating layers 330 and 344) and one via layer (insulating layer 340) in the structure shown in FIGS. 5 and 6, alternatively, a portion of the MIM capacitor bottom plates 378 may also be formed in three or more metallization layers and two or more via layers in accordance with embodiments of the present invention, (not shown).

Figure 7:
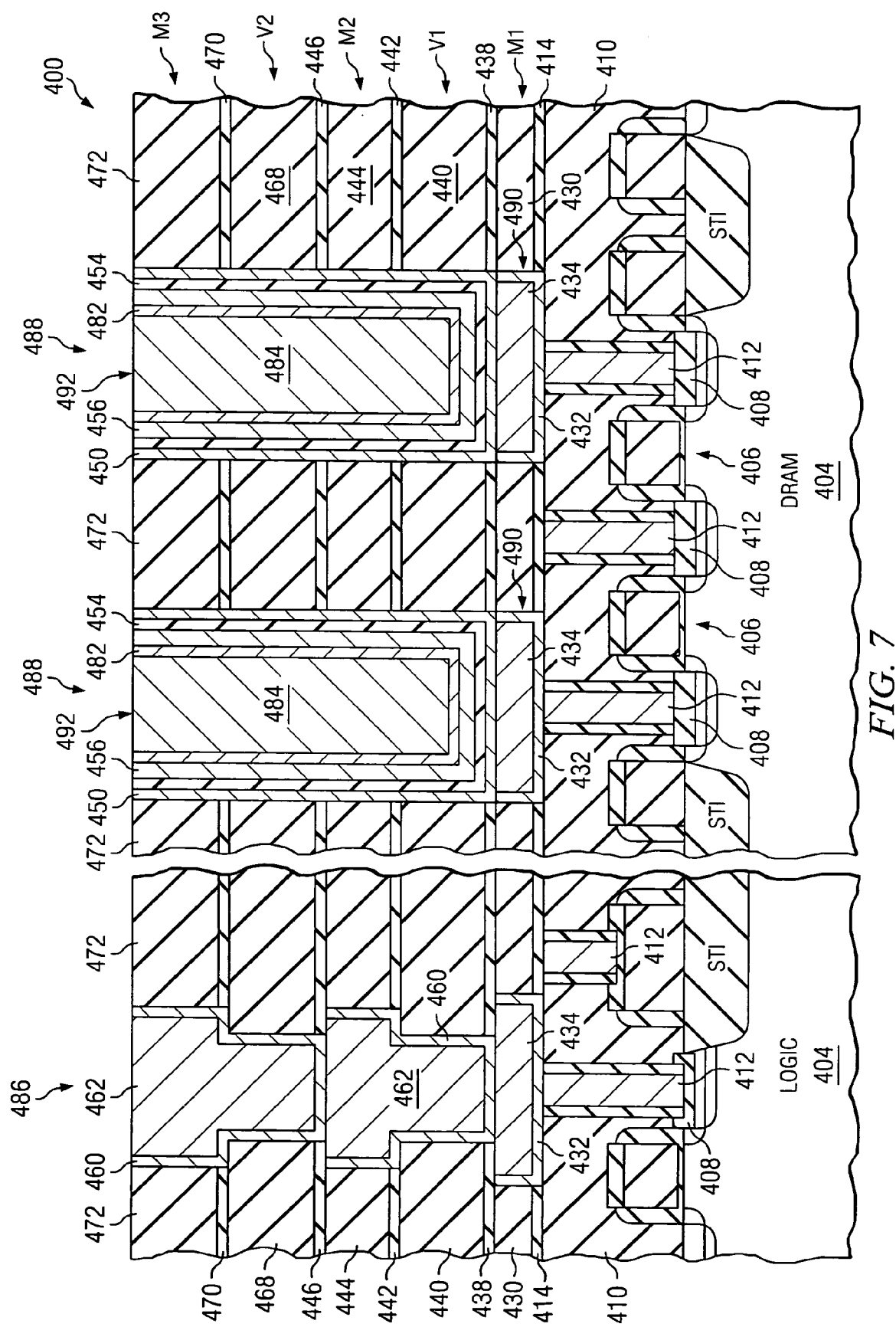
FIG. 7 illustrates a cross-sectional view of another embodiment of the present invention, wherein contact plugs are formed in a first interconnect layer, and wherein MIM capacitors are formed in a first via layer, a second interconnect layer, a second via layer, and a third interconnect layer of the device.

A third embodiment of the present invention is shown in a cross-sectional view in FIG. 7. In this embodiment, again, a portion of the bottom electrode 490 of the MIM capacitors 488 are formed in the first metallization layer M1. However, in this embodiment, the MIM capacitors 488 are formed in three or more of the insulating layers 440, 444, 468, and 472. For example, the MIM capacitors 488 are formed in the third insulating layer 440, the fourth insulating layer 444, the fifth insulating layer 468, and the sixth insulating layer 472. Note that the MIM capacitors 488 are also formed in the respective stop layers, which include second stop layer 438, third stop layer 442, fourth stop layer 446, and fifth stop layer 470. A sixth stop layer may also be used over the top surface of the sixth insulating layer 472, not shown.

In this embodiment, prior to filling the third metallization layer M3 and the second via layer V2 with a conductive barrier layer 482 and a conductive material 484, the MIM capacitor pattern is formed in the top four insulating layers 472, 468, 444, and 440. While the logic region of the workpiece 404 is covered in photoresist, the insulating layers 472, 468, 444, and 440 and stop layers 438, 442, 446, and 470 are patterned, and the photoresist is removed. A conductive material layer 450 is deposited over the patterned insulating layers 472, 468, 444, and 440. The conductive material layer 450 is removed, and at least a portion of the sixth insulating layer 472 is removed between at least two adjacent MIM capacitor patterns. A dielectric layer 454 is deposited over the conductive material layer 450, a third conductive barrier layer 482 is deposited over the dielectric layer 454, and a third conductive material 484 is deposited over the third conductive barrier layer 482. A CMP process is then used to remove the excess third conductive material 484, third conductive barrier layer 482, dielectric layer 454, and conductive material layer 450 from over the top surface of the sixth insulating layer 472. The MIM capacitor 488 comprises a bottom plate or electrode 490 comprising conductive barrier layer 432, conductive material 434, and conductive material layer 450. The MIM capacitor 488 comprises a top plate or electrode 492 comprising top plate electrode material 456, conductive barrier layer 482, and conductive material 484.

Advantageously, again in this embodiment, preferably the top or sixth insulating layer 472 is recessed by an amount d2 from the top surface, such that a connecting region 465 between one or more adjacent MIM capacitors 488 is formed, as shown in FIG. 8, which shows a 90 degree rotated cross-sectional view of the view shown in FIG. 7.

While the MIM capacitors 488 are formed in two metallization layers M2 and M3 (insulating layers 444 and 472, respectively) and two via layers V1 and V2 (insulating layers 440 and 468, respectively) in the structure shown in FIGS. 7 and 8, one or more MIM capacitors may also be formed in three or more metallization layers and three or more via layers in accordance with embodiments of the present invention, (not shown).

Note that like numerals are used to number the elements in FIGS. 7 and 8 as are used to number the elements in FIGS. 2A through 2M, FIGS. 3A through 3M, FIGS. 4A through 4M, FIG. 5 and FIG. 6. As such, only the elements that related to the above discussion for FIGS. 7 and 8 are described. A description of every element number in FIGS. 7 and 8 is not repeated herein: reference should be made to the prior figures and discussion thereof.

Advantages of embodiments of the present invention include providing a method of forming MIM capacitors 266, 376, and 488 that reduces the risk of bitline contact to top plate electrode shorting. MIM capacitors with increased capacitance for a given layout area may be manufactured by forming the MIM capacitors 266, 376, and 488 in two or more insulating layers of the semiconductor device. The bottom electrode of the MIM capacitors 266, 376, and 488 may comprise a conductive plug formed in a first metallization layer and/or subsequent metallization layers, for example. Overlay process margins are improved by coupling adjacent MIM capacitors 266, 376, and 488 together by recessing a top portion of the top insulating layer therebetween.

Embodiments of the present invention have useful application in many semiconductor applications. For example, the MIM capacitors 266, 376, and 488 described herein may be formed in stand-alone memory devices, embedded memory devices, non-voltage memory devices, ferro-electro memory devices, magneto-electro memory devices, static random access memory (SRAM) devices, dynamic random access memory (DRAM) devices, digital devices, RF devices, analog devices, or mixed-mode devices, as examples. The MIM capacitor structures 266, 376, and 488 and methods of manufacture described herein also may be used in capacitor over bitline (COB) or capacitor under bitline (CUB) structures, as examples. Embodiments of the novel MIM capacitor structures 266, 376, and 488 and methods of manufacture described herein may be implemented in the front end of the line (FEOL) or back end of the line (BEOL), for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    a workpiece;
    a first insulating layer formed over the workpiece;
    at least one second insulating layer formed over the first insulating layer; and
    a plurality of metal-insulator-metal (MIM) capacitors formed in the first insulating layer and the at least one second insulating layer, at least one of the plurality of MIM capacitors comprising a first conductive layer, a dielectric layer disposed over the first conductive layer, and a second conductive layer formed over the dielectric layer, and wherein the first conductive layer extends completely to a top surface of the at least one second insulating layer, wherein the at least one second insulating layer comprises a recessed region between at least two adjacent MIM capacitors, the at least two adjacent MIM capacitors having top plates comprised of the second conductive layer, wherein the second conductive layer within the recessed region electrically couples the top plates of the at least two adjacent MIM capacitors.

2. The semiconductor device according to claim 1, wherein the first conductive layer and the second conductive layer comprise a refractory metal, TiN, TaN, Ta, TaSiN, TiW, NiCr, MoN, Ru, WN, WSi, Cu, Al, W, Ti, Ta, Co, N, Ni, Mo, other metals, combinations thereof or polysilicon, and wherein the MIM capacitors are formed in an interconnect layer of the semiconductor device.

3. The semiconductor device according to claim 1, wherein the dielectric layer comprises Al, Si, O, N, Ti, Ta, lead-zirconate-titanate (PZT), barium strontium titanate (BST), $Ta_2O_5$, $Al_2O_3$, $SiO_2$, or combinations thereof.

4. The semiconductor device according to claim 1, wherein at least one of the plurality of MIM capacitors comprises an array of memory devices, the array having a dimension of 2×1 or greater.

5. The semiconductor device according to claim 1, wherein the first conductive layer comprises a bottom electrode, the dielectric layer comprises a capacitor dielectric, and the second conductive layer comprises a top electrode, wherein the bottom electrode, top electrode, or both are formed by a chemical-mechanical polish (CMP) process.

6. The semiconductor device according to claim 1, wherein the MIM capacitors are formed in a stand-alone memory device, embedded memory device, non-voltage memory device, ferro-electro memory device, magneto-electro memory device, static random access memory (SRAM) device, dynamic random access memory (DRAM) device, digital device, RF device, analog device, or mixed-mode device.

7. The semiconductor device according to claim 1, wherein the workpiece comprises a first region and a second region, wherein at least one of the plurality of MIM capacitors is formed over the first region, further comprising conductive regions formed in the first insulating layer and the at least one second insulating layer over the second region of the workpiece.

8. The semiconductor device according to claim 1, wherein the second conductive layer of the plurality of MIM capacitors comprises a conductive barrier layer and a conductive material disposed over the conductive barrier layer.

9. The semiconductor device according to claim 1, wherein the at least one second insulating layer comprises 2, 3, 4, 5, or 6 or more insulating layers, wherein the MIM capacitors are formed in the entire thicknesses of the second insulating layers.

10. The semiconductor device according to claim 9, wherein the workpiece comprises a plurality of elements formed therein, further comprising:
    at least one third insulating layer disposed between the workpiece and the first insulating layer; and
    at least one conductive region formed in each third insulating layer abutting the first conductive layer of at least one of the plurality of MIM capacitors, wherein each conductive region and the first conductive layer comprise a bottom plate of at least one of the plurality of MIM capacitors, and wherein the at least one conductive region makes electrical contact to an element in the workpiece.

11. The semiconductor device according to claim 10, wherein the at least one third insulating layer comprises a first metallization layer of the semiconductor device, wherein the first insulating layer comprises a first via layer of the scmiconductor device, wherein the at least one second insulating layer comprises a second metallization layer of the semiconductor device, and wherein at least one of the plurality of MIM capacitors is formed in the first via layer and the second insulating layer of the semiconductor device.

12. The semiconductor device according to claim 1, wherein the workpiece comprises a plurality of elements formed therein, further comprising a third insulating layer formed between the workpiece and the first insulating layer, further comprising at least one first conductive region disposed in the third insulating layer abutting the first conductive layer of the at least one of the plurality of MIM capacitors, wherein the at least one first conductive region and the first conductive layer comprise a bottom plate of at least one of the plurality of MIM capacitors.

13. The semiconductor device according to claim 12, wherein the at least one first conductive region comprises a conductive barrier layer and a conductive material disposed over the conductive barrier layer.

14. The semiconductor device according to claim 12, wherein the at least one first conductive region electrically couples at least one of the plurality of MIM capacitors to an element in the workpiece.

15. The semiconductor device according to claim 12, wherein the at least one first conductive region and the third insulating layer comprise a first metallization layer of the semiconductor device, wherein the first insulating layer comprises a first via layer of the semiconductor device, wherein the second insulating layer comprises a second metallization layer of the semiconductor device, and wherein at least one of the plurality of MIM capacitors is formed in the first via layer and the second metallization layer of the semiconductor device.

16. A semiconductor device, comprising:
a workpiece;
a first insulating layer formed over the workpiece;
at least one second insulating layer formed over the first insulating layer; and
at least one metal-insulator-metal (MIM) capacitor formed in the first insulating layer and the at least one second insulating layer, the at least one MIM capacitor comprising a first conductive layer, a dielectric layer disposed over the first conductive layer, and a second conductive layer formed over dielectric layer, and wherein the first conductive layer extends completely to a top surface of the at least one second insulating layer;
wherein the at least one second insulating layer comprises 2, 3, 4, 5, or 6 or more insulating layers, wherein the at least one MIM capacitor is formed in the entire thicknesses of the second insulating layers;
wherein the workpiece comprises a plurality of elements formed therein, further comprising at least one third insulating layer disposed between the workpiece and the first insulating layer and at least one conductive region formed in each third insulating layer abutting the first conductive layer of the at least one MIM capacitor, wherein each conductive region and the first conductive layer comprise a bottom plate of the at least one MIM capacitor, and wherein the at least one conductive region makes electrical contact to an element in the workpiece; and
wherein the at least one third insulating layer comprises a first metallization layer, at least one first via layer and at least one second metallization layer of the semiconductor device, wherein the first insulating layer comprises at least one second via layer of the semiconductor device, wherein the at least one second insulating layer comprises at least one third metallization layer of the semiconductor device, wherein the at least one MIM capacitor is formed in the at least one second via layer and the at least one third insulating layer of the semiconductor device, and wherein a bottom plate of the at least one MIM capacitor comprises the first conductive layer and the conductive regions in the third insulating layer.

17. A semiconductor device, comprising:
a workpiece;
a first insulating layer formed over the workpiece;
at least one second insulating layer formed over the first insulating layer; and
at least one metal-insulator-metal (MIM) capacitor formed in the first insulating layer and the at least one second insulating layer, the at least one MIM capacitor comprising a first conductive layer, a dielectric layer disposed over the first conductive layer, and a second conductive layer formed over the dielectric layer, and wherein the first conductive layer extends completely to a top surface of the at least one second insulating layer;
wherein the workpiece comprises a first region and a second region, wherein the at least one MIM capacitor is formed over the first region, further comprising conductive regions formed in the first insulating layer and the at least one second insulating layer over the second region of the workpiece; and
wherein the first region comprises a DRAM region, wherein the second region comprises a logic region, and wherein the at least one MIM capacitor comprises a storage node of a DRAM memory cell in the DRAM region.

18. The semiconductor device according to claim 17, wherein a surface of the conductive regions formed in the at least one second insulating layer over the second region of the workpiece and a surface of the second conductive layer over the first region have been polished simultaneously using a chemical mechanical polishing process such that the surface of the conductive regions and the surface of the second conductive layer are substantially coplanar.

19. The semiconductor device according to claim 17, wherein the conductive regions formed in the at least one second insulating layer over the second region of the workpiece comprise the same material as at least a portion of the second conductive layer over the first region.

20. A semiconductor device, comprising:
a workpiece;
a first insulating layer formed over the workpiece;
at least one second insulating layer formed over the first insulating layer; and
at least one metal-insulator-metal (MIM) capacitor formed in the first insulating layer and the at least one second insulating layer, the at least one MIM capacitor comprising a first conductive layer, a dielectric layer disposed over the first conductive layer, and a second conductive layer formed over the dielectric layer, and wherein the first conductive layer extends completely to a top surface of the at least one second insulating layer;
wherein the workpiece comprises a first region and a second region, wherein the at least one MIM capacitor is formed over the first region, further comprising conductive regions formed in the first insulating layer and the second insulating layer over the second region of the workpiece; and
wherein the first insulating layer comprises a via layer of the semiconductor device, wherein the second insulating layer comprises a metallization layer of the semiconductor device, and wherein the conductive regions in the second region comprise a dual damascene structure.

21. A semiconductor device, comprising:
a workpiece;
a first insulating layer formed over the workpiece;
at least one second insulating layer formed over the first insulating layer; and
at least one metal-insulator-metal (MIM) capacitor formed in the first insulating layer and the at least one second insulating layer, the at least one MIM capacitor comprising a first conductive layer, a dielectric layer disposed over the first conductive layer, and a second conductive layer formed over the dielectric layer, and wherein the first conductive layer extends completely to a top surface of the at least one second insulating layer;
wherein the workpiece comprises a plurality of elements formed therein, further comprising a third insulating layer formed between the workpiece and the first insulating layer, further comprising at least one first conductive region disposed in the third insulating layer abutting the first conductive layer of the at least one MIM capacitor, wherein the at least one first conductive region and the first conductive layer comprise a bottom plate of the at least one MIM capacitor, and
further comprising at least one fourth insulating layer disposed between the first insulating layer and the third insulating layer, and a second conductive region formed in each at least one fourth insulating layer between the first conductive region and the at least one MIM capacitor, wherein the second conductive region electrically couples the at least one MIM capacitor to the first conductive region.

22. The semiconductor device according to claim 21, wherein the third insulating layer and the at least one first conductive region comprise a first metallization layer of the semiconductor device, wherein the at least one fourth insulating layer and the second conductive region comprise a first via layer and a second metallization layer of the semiconductor device, wherein the first insulating layer comprises a second via layer of the semiconductor device, wherein the second insulating layer comprises a third metallization layer of the semiconductor device, and wherein the at least one MIM capacitor is formed in the second via layer and the third metallization layer of the semiconductor device.

23. A semiconductor device, comprising:
a workpiece;
a first insulating layer formed over the workpiece;
a second insulating layer formed over the first insulating layer;
at least one third insulating layer formed over the second insulating layer; and
a plurality of metal-insulator-metal (MIM) capacitors formed in the at least one third insulating layer, the second insulating layer, and the first insulating layer, at least one of the plurality of MIM capacitors comprising a first conductive layer, a dielectric layer disposed over the first conductive layer, and a second conductive layer formed over the dielectric layer, wherein the at least one third insulating layer comprises a recessed region between at least two adjacent MIM capacitors, the at least two adjacent MIM capacitors having top plates comprised of the second conductive layer, wherein the second conductive layer within the recessed region electrically couples the top plates of the at least two adjacent MIM capacitors.

24. The semiconductor device according to claim 23, wherein the first insulating layer comprises a first via layer of the semiconductor device, wherein the second insulating layer comprises a first metallization layer of the semiconductor device, wherein the at least one third insulating layer comprises at least one second via layer and at least one second metallization layer of the semiconductor device, wherein at least one of the plurality of MIM capacitors extends through the entire thicknesses of the first via layer, the first metallization layer, the at least one second via layer, and the at least one second metallization layer.

25. The semiconductor device according to claim 23, wherein the workpiece comprises a plurality of elements formed therein,, further comprising:
at least one fourth insulating layer disposed between the workpiece and the first insulating layer; and
at least one conductive region formed in each fourth insulating layer between the first conductive layer of at least one of the plurality of MIM capacitors and an element in the workpiece, wherein each conductive region and the first conductive layer comprise a bottom plate of at least one of the plurality of MIM capacitors.

26. The semiconductor device according to claim 25, wherein the at least one fourth insulating layer comprises a first metallization layer of the semiconductor device, wherein the first insulating layer comprises a first via layer of the semiconductor device, wherein the second insulating layer comprises a second metallization layer of the semiconductor device, wherein the at least one third insulating layer comprises at least one second via layer and at least one third metallization layer of the semiconductor device, and wherein at least one of the plurality of MIM capacitors extends through the entire thicknesses of the first via layer, the second metallization layer, the at least one second via layer, and the at least one second metallization layer.

27. A semiconductor device, comprising:
a workpiece;
at least one first insulating layer formed over the workpiece; and
a plurality of metal-insulator-metal (MIM) capacitors formed in the at least one first insulating layer, the plurality of MIM capacitors comprising a first conductive layer, a dielectric layer disposed over the first conductive layer, and a second conductive layer formed over the dielectric layer, the second conductive layer comprising a top plate of the plurality of MIM capacitors, wherein a top of the at least one first insulating layer comprises a recessed region between at least two adjacent MIM capacitors, and wherein the second conductive layer fills the recessed region of the top of the at least one first insulating layer, electrically coupling together the top plates of the at least two adjacent MIM capacitors.

28. The semiconductor device according to claim 27, wherein the at least one first insulating layer comprises at least two insulating layers, wherein one first insulating layer comprises a via layer of the semiconductor device, and wherein another first insulating layer comprises an interconnect layer formed ova the via layer.

29. The semiconductor device according to claim 27, wherein the workpiece comprises a plurality of elements formed therein, further comprising at least one second insulating layer formed between the workpiece and the first insulating layer, further comprising a conductive region formed in each at least one second insulating layer, the conductive regions electrically coupling the first conductive layer of the MIM capacitors to an element in the workpiece, wherein the conductive regions and the first conductive layer comprise a bottom plate of at least one MIM capacitor.

30. The semiconductor device according to claim 29, wherein the at least one first insulating layer comprises at least two insulating layers, wherein the conductive region and the at least one second insulating layer comprise at least one first metallization layer of the semiconductor device, wherein one first insulating layer comprises a first via layer formed over the at least one first metallization layer, and wherein another first insulating layer comprises a second metallization layer formed over the first via layer.

* * * * *

UNITED STATES PATENT AND TRADEMARK OFFICE
CERTIFICATE OF CORRECTION

PATENT NO. : 7,282,757 B2
APPLICATION NO. : 10/689294
DATED : October 16, 2007
INVENTOR(S) : Tu et al.

It is certified that error appears in the above-identified patent and that said Letters Patent is hereby corrected as shown below:

In Col. 14, line 8, delete "thereof" and insert --thereof,--.
In Col. 15, line 42, delete "over" and insert --over the--.
In Col. 18, line 63, delete "ova" and insert --over--.

Signed and Sealed this

Fifteenth Day of January, 2008

JON W. DUDAS
*Director of the United States Patent and Trademark Office*